United States Patent [19]
Inkol

[11] Patent Number: 5,504,455
[45] Date of Patent: Apr. 2, 1996

[54] EFFICIENT DIGITAL QUADRATURE DEMODULATOR

[75] Inventor: Robert J. Inkol, Orleans, Canada

[73] Assignee: Her Majesty the Queen as represented by the Minister of National Defence of Her Majesty's Canadian Government, Ontario, Canada

[21] Appl. No.: 441,915

[22] Filed: May 16, 1995

[51] Int. Cl.$^6$ .............................. H03D 3/00; H04L 27/22
[52] U.S. Cl. .......................... 329/304; 329/310; 375/328; 375/329
[58] Field of Search ..................................... 329/304–310; 375/279–284, 324, 328, 329–333, 350

[56] References Cited

U.S. PATENT DOCUMENTS

| | | |
|---|---|---|
| 4,090,145 | 5/1978 | Webb .......................................... 329/1 |
| 4,468,794 | 8/1984 | Waters et al. ............................ 375/103 |
| 4,829,465 | 5/1989 | Knauer et al. ........................... 364/725 |

OTHER PUBLICATIONS

"The Correction of I and Q Errors in a Coherent Processor" by F. E. Churchill et al—published in IEEE Transactions on Aerospace and Electronic Systems, vol. 17, No. 1, Jan. 1981, pp. 131 to 137.

"The Effects of Quadrature Sampling Imbalances on a Phase Difference Analysis Technique" by D. L. Sharpin et al—presented at the 1990 National Aerospace Electronics Conference in Dayton, Ohio on 21–25 May, 1990, pp. 962 to 968.

"Quadrature Sampling With High Dynamic Range" by D. W. Rice et al—published in IEEE Transactions on Aerospace and Electronic Systems, vol. 18, No. 4, Nov. 1982, pp. 736 to 739.

"A Simple Method for Sampling In–Phase and Quadrature Components" by C. M. Rader—published in IEEE Transactions on Aerospace and Electronic Systems, vol. 20, No. 6, Nov. 1984, pp. 821 to 824.

"Creating Complex Signal Samples From a Band–Limited Real Signal" by R. L. Mitchell—published in IEEE Transactions on Aerospace and Electronic Systems, vol. 25, No. 3, May 1989, pp. 425 to 427.

"A Novel Approach to the Design of I/Q Demodulation Filters" by G. Zhang et al—presented at the IEEE Pacific Rim Conference on Communications, Computers and Signal Processing in Victoria, B.C. on 20–21 May 1993, pp. 72 to 76.

"VLSI Architectures for the Finite Impulse Response Filter" by K. H. Cheng et al—published in the IEEE Jrn. on Selected Areas in Communications, vol. SAC–4, No. 1, Jan. 1986, pp. 92 to 99.

(List continued on next page.)

*Primary Examiner*—David Mis
*Attorney, Agent, or Firm*—Larson and Taylor

[57] ABSTRACT

A digital quadrature demodulator for an intermediate frequency (IF) input signal with an analog-to-digital (A/D) converter having a sampling frequency $f_s$ and an input to which the IF input signal is applied where the IF input signal has a bandwith $B < f_s/4$ centered about a frequency of $f_s/4$. The demodulator includes an arrangement to direct even numbered output signals from the A/D converter to an inphase channel and odd numbered output signals from the A/D converter to a quadrature channel where each channel contains a highpass filter and the demodulator includes circuits to decimate by 4 signals of the channels to generate, together with the filters, a quadrature output signal Q(nT) at an output of the quadrature channel and an inphase output signal I(nT) at an output of the inphase channel. The quadrature highpass filter in the quadrature channel has an optimized transform architecture in which the filter coefficients $h_k$ correspond to those of a lowpass prototype filter with N=2k+1 coefficients after multiplication by $\sin(k\pi/2)$ where k identifies a particular stage of the filter. The inphase highpass filter in the inphase channel has an optimized transform architecture in which the filter coefficients $h_k$ correspond to those of a lowpass prototype filter after multiplication by $\cos(k\pi/2)$. Employing optimized filter architectures and simplified filter coefficients obtained with a new design procedure provides a practical quadrature demodulator design which can be economically implemented in hardware.

20 Claims, 8 Drawing Sheets

OTHER PUBLICATIONS

"The Design of Multiplierless Digital Data Transmission Filters With Powers-of-Two Coefficients" by H. Samueli—The Proceedings of IEEE Telecommunications Symposium on 3–6 Sep. 1990, pp. 0425 to 0429.

"An Efficient Digital Quadrature Demodulator" by Robert J. Inkol et al—presented at IEEE Kingston Section, 17th Biennial Symposium on Communications in Kingston, Ontario on 30 May–1 Jun. 1994. pp. 239–242.

ચાર,504,455

EFFICIENT DIGITAL QUADRATURE DEMODULATOR

FIELD OF THE INVENTION

The present invention relates generally to signal demodulators for communication, radar and electronic warfare systems that use quadrature demodulation techniques and in particular to new designs for quadrature demodulation filters to process digital signal data in the demodulators.

BACKGRGUND OF THE INVENTION

Quadrature demodulation is widely used in communication and radar systems since it provides an efficient representation of a bandpass signal and allows for the direct extraction of amplitude and phase information. Wide bandwidth requirements, those exceeding a few MHz, have tended to favour the use of an analog approach in quadrature demodulators. In these analog systems, inphase (I) and quadrature (Q) signals are generated from a continuous time radio frequency (RF) signal that has been received and shifted in frequency to be approximately centered on a convenient intermediate frequency (IF) fzF- This IF signal is mixed with a pair of sinusoids in phase quadrature and at a frequency fzF in two separate channels. The I and Q signals are then obtained by lowpass filtering to remove the sum frequency components generated by the mixing operation. The I and Q signals can be digitized by an analog-to-digital (A/D) converter in each channel, if desired, for further processing by digital techniques. These analog signal quadrature demodulators have the advantage that bandwidths on the order of 500 MHz can be readily achieved with available technology. Furthermore, the use of separate A/D converters for each of the I and Q signal channels will double the bandwidth for a given A/D sampling rate ($f_s$) since the Nyquist frequency for an analytic signal is $f_s$ instead of $f_s/2$.

Proper processing for quadrature demodulators requires frequency translation, phase shifting and filtering operations which must be accurately implemented to preserve the phase and amplitude information present in the IF input signal. In a quadrature demodulator implemented using analog techniques, the IF input signal s(t) is processed by mixing (i.e., heterodyning) with signals of the form A cos $(2\pi f_{IF}t)$ in the I channel and −A sin $(2\pi f_{IF}t)$ in the Q channel where A, $f_{IF}$ and t represent the mixing signal amplitude, the expected center frequency of the IF signal and time. The output signals from the two mixers are lowpass filtered to yield the I and Q signals. Any gain or phase errors which are created by processing I and Q signals in the separate channels will limit the performance of the system. The spectrum of the IF input signal can vary over time and can contain components at different frequencies. Therefore, the performance of the system is dependent upon the accuracy with which the gain and phase of the separate quadrature channels match over the bandwidth of the IF signal. It can be shown that the phase error of a quadrature demodulator resulting from differences in the gains of the two channels is given by $[\arctan |H_q(f_p)|/|H_i(f_p)|-\pi/4]$ where $|H_i(f_p)|$ and $|H_q(f_p)|$ are the amplitude of the output signals from the inphase and quadrature channels respectively, for a sinusoidal input signal of frequency $f_p$. Significant errors are generally observed when analog techniques are used in practical applications. Analog quadrature demodulator implementations suitable for applications requiring low phase or amplitude errors over a wide bandwidth, such as in radar signal processing, are generally expensive since carefully matched components must be used in the I and Q channels and it may be necessary to operate these at a controlled temperature.

Techniques for correcting errors in the I and Q signals have been proposed in an article by F. E. Churchill et al entitled "The Correction of I and Q Errors in a Coherent Processor" which was published in the *IEEE Transactions on Aerospace and Electronic systems*, Vol. 17, No. 1 in January 1981 and in a further article by D. L. Sharpin et al entitled "The Effects of Quadrature Sampling Imbalances on a Phase Difference Analysis Technique" presented at the 1990 National Aerospace Electronics Conference in Dayton, Ohio (May 21–25, 1990). However, these techniques for correcting errors in the I and Q signals are nontrivial to implement since the errors must be measured with appropriate test signals and the necessary correction algorithms carried out.

Consequently, it would be highly desirable to be able to implement quadrature demodulation in detectors utilizing digital signal processing (DSP) techniques. Digital signal processing techniques are stable, repeatable and predictable which makes those techniques highly advantageous for signal processing. Furthermore, the DSP techniques can often be implemented at a relatively low cost using Very Large Scale Integration (VLSI) technology. However, up to present, digital signal processing techniques used in quadrature demodulators have generally been limited to apparatus for processing relatively narrow bandwidths compared to the much larger bandwidths which can be effectually processed by analog techniques.

Various algorithms have been proposed for digital quadrature demodulation. The most direct approach for quadrature mixing and lowpass filtering is to sample and digitize the IF data signal and to replace the analog signal processing blocks in the analog implementation with their digital equivalents. This approach is described by Webb in U.S. Pat. No. 4,090,145 which issued on May 16, 1978. An implementation of this approach as a set of VLSI components has been developed by the GEC Plessey Company. The chip set includes the PDSP16350 digital sign/cosine generator and dual multiplier, and PDSP16256 digital filter. This approach is however very expensive in computational cost. In addition to two filters, much additional hardware is required to accurately generate sampled sinusoidal and cosinusoidal signals for the mixing. This is reflected in the fact that the GEC Plessey implementation requires multiple components and achieves a maximum bandwidth of less than 10 MHz.

The principal alternative approach for implementing digital quadrature demodulation uses complex filtering and is based on the use of Hilbert transformers. The Hilbert transformers are allpass filters designed to realize a 90° relative phase shift. A practical implementation of this concept is described by D. W. Rice et al in an article "Quadrature Sampling With High Dynamic Range" which was published in the *IEEE Transactions on Aerospace and Electronic Systems*, Vol. AES-18, No. 4 in November 1982. Only one filter and a pair of mixers are required in the implementation described by Rice et al and the filter can be designed as a symmetric odd length Finite Impulse Response (FIR) filter whose even coefficients are zero. The elimination of the filter in the I channel reduces computational cost. However, a problem with Hilbert Transformer based approaches is that the quadrature demodulator does not have useful stopbands in its frequency response. As a result the performance is degraded by DC offsets added to the digitized IF signal by an imperfectly adjusted analog-to-digital converter. In addition, the analog IF filters preceding the analog-to-digital converter must be very selective to avoid problems caused by signals outside the usable bandwidth of the quadrature demodulator. Consequently, the digitized IF signal data was processed by a digital bandpass filter preceding the quadrature demodulator in the implementation described by Rice.

It should be noted that a saving in computational costs can be realized by constraining the IF to $f_s/4$, $f_s$ being the rate at which the IF signal is sampled. The particular and unique effects of constraining the IF to $f_s/4$ are described by Waters et al in U.S. Pat. No. 4,468,794 which issued on Aug. 28, 1984. Constraining the IF to $f_s/4$ simplifies the sampled sinusoids used for mixing to sequences of $+1,0,-1,0,\ldots$, and effectively halves the computational cost of the filters since there is no need to explicitly filter signal samples that have been multiplied by zero. A further reduction in computational cost can be realized by using a method described by C.M. Rader in an article "A Simple Method for Sampling In-Phase and Quadrature Components" which was published in the *IEEE Transactions on Aerospace and Electronic Systems,* Vol. 20, No. 6 in November, 1984.

The signal, occupying a bandwidth $<f_s/4$ centred about an IF of $f_s/4$, is sampled and filtered by two Infinite Impulse Response (IIR) filters designed for a 90° relative phase shift in the method described by C. M. Rader. A decimation by 4 reduces the output sample rate from each filter to $f_s/4$ and results in the translation of the filtered signals to baseband as a result of aliasing. This type of approach is computationally efficient since very simple filters having a few poles and zeros are used. Rader also proposed a modified design in which the sampled input signal is split into two streams of even and odd samples which are processed by the quadrature (Q) and inphase (I) channels respectively. Drawbacks with this design are that the accuracy is limited, the output signal is generated with a frequency dependent delay and additional filters may be required to constrain the bandwidth of the input signal to $f_s/4$. The problem of a frequency dependent delay can be avoided by replacing the pair of IIR filters with a symmetric FIR filter and delay line as proposed by R.L. Mitchell in an article "Creating Complex Signal Samples from a Band-Limited Real Signal" which was published in the *IEEE Transactions on Aerospace and Electronic Systems,* Vol. 25, No. 3 in May 1989. However, this approach is sensitive to DC offsets in the digitized IF signal data. A simple DC cancellation filter was proposed by Mitchell, but this filter limits the useful bandwidth.

An algorithm conceptually similar to the one described by C. M. Rader, but which differs in the choice of filters, was proposed by G. Zhang et al in an article "A Novel Approach to the Design of I/Q Demodulation Filters" which was presented at the IEEE Pacific Rim Conference on Communications, Computers and Signal Processing in Victoria, B.C. on May 20-21, 1993. The basic concept proposed by G. Zhang et al is to use symmetric FIR inphase and quadrature filters, followed by decimation by 4. The bandpass output signals from the filters are translated in frequency to baseband as a result of decimation by 4 since the input signal is centred on an IF of $f_s/4$. One disadvantage of this approach is the computational cost of the filters. However, that cost can be significantly reduced by selecting appropriate design specifications for the filters. Since, for instance, the maximum usable bandwidth is always limited to $f_s/4$ by aliasing, it is logical to select a corresponding filter bandwidth specification. Since undesired signals separated from the IF by a frequency between $f_s/8$ and $3f_s/8$ are attenuated, the stopband attenuation performance requirements for the analog IF filter are relaxed and DC offsets from the A/D converter suppressed. This choice of bandwidth has the implication that the bandpass filters can be derived from a quarter-band lowpass filter prototype. Fractional-band filters are characterized by an odd number of coefficients and a time domain response with even symmetry. These filters have the advantage that a portion of their coefficients are equal to zero. The design approach presented for the filters used in the proposed quadrature demodulator are as follows:

1. Design a quarter-band linear phase Finite Impulse Response lowpass filter with $N=2K+1$ coefficients $\{h_{-K}, h_{-(K-1)}, \ldots, h_{-1}, h_0, h_1, \ldots, h_{(K-1)}, h_K\}$. Note that the requirement for linear phase results in the symmetry constraint on the filter coefficients that $h_{-k}=h_k$. The constraint that (N−5) is exactly divisible by 8 will ensure that the first and last coefficients of each of the inphase and quadrature filters are nonzero. This constraint is not essential, but testing has shown that it results in better performance relative to computational cost than is usually obtained with the other possibilities. Any of the standard methods of designing linear phase Finite Impulse Response lowpass filters may be used. It should be noted that there are tradeoffs between the number of coefficients, the width of a passband meeting a given ripple specification and the stopband attenuation.

2. Generate the inphase filter by multiplying the prototype lowpass filter coefficients by $\cos(k\pi/2)$.

3. Generate the quadrature filter by multiplying the prototype lowpass filter coefficients by $\sin(k\pi/2)$.

Most of the coefficients in these two filters are equal to zero since the pair of quadrature filters has the same number of nonzero coefficients as the prototype quarter-band lowpass filter.

In the algorithm described by G. Zhang et al streams of even and odd samples from an A/D converter are separately processed by quadrature highpass filters derived from the corresponding bandpass filters by deleting the coefficients constrained to zero in steps 2 and 3. The inphase filter will now be a half-band filter which still has nearly half its coefficients equal to zero.

The algorithm described by G. Zhang et al is computationally efficient since mixing and filtering are combined with no additional filtering being required to eliminate DC offset errors. The total number of nonzero filter coefficients is equal to $(3N+5)/4$. Therefore, the computational cost in multiplications/second for real-time operation is equal to $(f_s/16)(3N+5)$ since each coefficient only multiplies ¼ of the signal samples generated by the A/D converter because of the decimation by 4 operations. This, potentially, can be further reduced by a factor of nearly 2 if the symmetry of the filter coefficients is exploited.

In the design of quadrature demodulators implemented with digital signal processing, good phase and amplitude accuracy over a large effective bandwidth is required for a number of applications such as radar and electronic support measures (ESM) systems. The delay of the quadrature demodulator should be frequency independent for processing wideband signals. In applications where the signal of interest is typically a sinusoid whose instantaneous frequency is likely to be offset from the IF, any significant mismatch in the frequency responses of the two channels is undesirable. The phase of the output signal is the 4 quadrant arctangent of Q(t)/I(t) and, as a result, there will be spurious phase modulation having a frequency component related to the carrier frequency offset. This tends to be a deficiency of the previous approaches based on the use of Hilbert transformers unless a sufficiently large number of filter coefficients is used to ensure an adequately flat passband frequency response. A further requirement is that any DC offsets from the A/D converters should not affect the quadrature demodulator performance.

The achievable performance of these quadrature demodulators, for a given bandwidth, is dependent on the A/D converter sampling rate and the effective resolution of the A/D converter over the bandwidth occupied by the bandpass IF signal as well as by the accuracy of the quadrature demodulator algorithm. There is generally a tradeoff between accuracy, the desired bandwidth and computational cost. Any reduction in computational cost obtained with a new algorithm is potentially useful in facilitating the practical real-time implementation of a quadrature demodulator. However, it has been difficult with present approaches to achieve bandwidths of more than approximately 10–25 MHz using currently available standard components such as the Harris HSP43891 digital FIR filter chip.

SUMMARY OF THE INVENTION

It is an object of the present invention to provide a practical quadrature demodulator design which can be economically implemented in special purpose hardware. This is achieved by employing optimized filter architectures and simplified filter coefficients obtained by a new design procedure. The design can provide wide bandwidths (50–100 MHz) if a high speed circuit technology (e.g. gallium arsenide) is used. If a lower bandwidth is sufficient, a very low cost implementation is possible by using a mature silicon technology.

A digital quadrature demodulation system, according to one embodiment of the present invention, for processing an intermediate frequency (IF) input signal, comprises an analog-to-digital (A/D) converter having sampling frequency f, and an input to which the IF input signal is applied, the IF input signal having a bandwidth $B<f_s/4$ centred about a frequency of $f_s/4$, wherein the demodulator has means to direct an output signal from the A/D converter to a quadrature channel, means to direct an output signal from the A/D converter to an inphase channel and means to decimate by 4 signals of the channels to generate, together with a first filter means in the quadrature channel, a quadrature output signal Q(nT) at an output of the quadrature channel and, together with a second filter means in the inphase channel, an inphase output signal I(nt) at an output of the quadrature channel; the first filter means for a signal in the quadrature channel comprising a quadrature highpass filter having an optimized transform architecture in which the filter coefficients hk correspond, to those of a lowpass prototype filter with N=2k+1 coefficients after multiplication by $\sin(k\pi/2)$, k identifying a particular stage of the filter, and the second filter means for a signal in the inphase channel comprising an inphase highpass filter having an optimized transform architecture in which the filter coefficients $h_k$ correspond to those of the lowpass prototype filter after multiplication by $\cos(k\pi/2)$.

BRIEF DESCRIPTION OF THE DRAWINGS

The following detailed description of the invention will be more readily understood when considered in conjunction with the accompanying drawings, in which.

DESCRIPTION OF THE PREFERRED EMBODIMENTS

Figure 1:
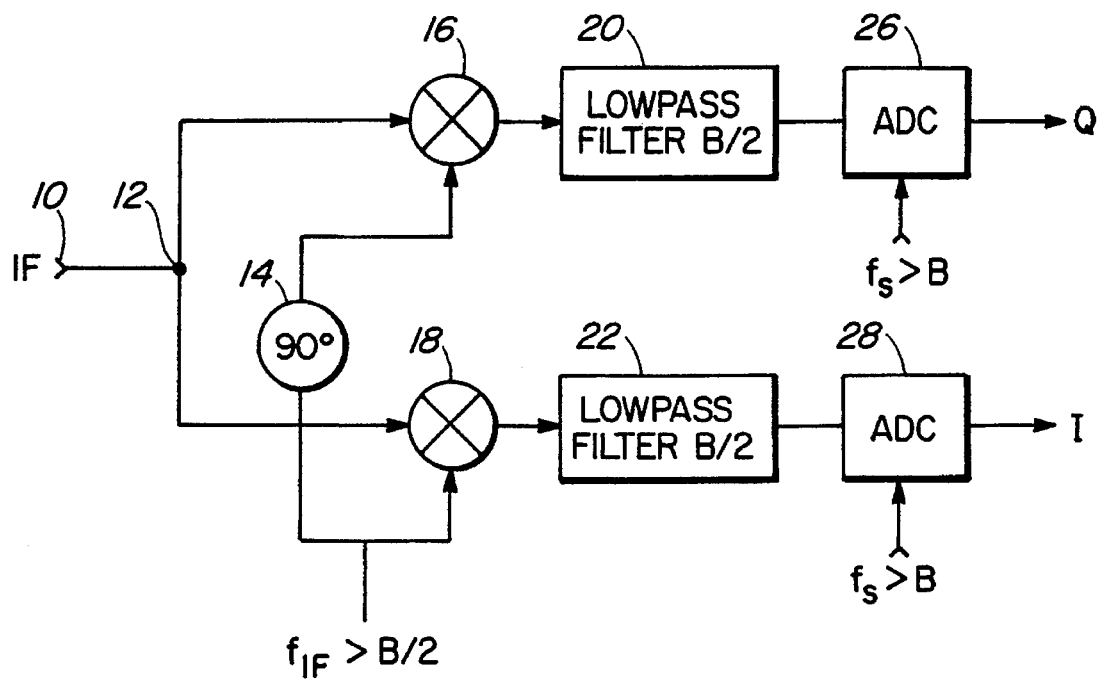
FIG. 1 is a schematic diagram of a conventional quadrature demodulator which employs analog signal processing technology.

Bandwidth requirements exceeding a few MHz have tended to favour the use of an analog signal processing circuitry for quadrature demodulators such as that illustrated in FIG. 1. In FIG. 1, an analog intermediate frequency (IF) data signal of bandwidth B centred on a suitable intermediate frequency fmF at input 10 is split at 12 and applied to inputs of two mixers 16 and 18. The other input of mixer 18 is supplied with a signal $f_{IF}$, where $f_{IF}>B/2$, from a local oscillator which is combined with the input IF to generate sum and difference signals. The output from mixer 18 is then directed through a lowpass filter 22 to remove the sum signal which results in the generation of an inphase (I) signal at the output of the filter 22. In a similar manner, the f signal from the local oscillator is applied through a 90° phase shifter 14 to the other input of mixer 16 where it is mixed with the IF input data signal. The output of mixer 16 is then directed through a lowpass filter 20 whose output provides the quadrature (Q) signal. The I and Q signals, in separate channels, may then be digitized for further processing as illustrated in FIG. 1, the Q signal being digitized by analog-to-digital (A/D) converter 26 and the I signal by A/D converter 28. A/D converters 26 and 28 have a sampling rate $f_s>B$. The use of separate A/D converters for each of the I and Q signals doubles the bandwidth for a given sampling rate $f_s$ since the Nyquist frequency for an analytic signal is $f_s$ instead of $f_s/2$. However, these analog implementations tend to be expensive due to the need for carefully matched components in each channel to keep phase errors within acceptable levels. Therefore, the use of digital signal processing (DSP) for quadrature demodulation would generally be more desirable if the bandwidth requirements can be met with a practically achievable computational cost.

Various algorithms have been proposed for digital quadrature demodulation. The most direct approach for digital quadrature demodulation and lowpass filtering is to sample and digitize the IF signal and replace the analog signal processing blocks in FIG. 1 with their digital equivalents. In this digital implementation, a saving in computational cost can be realized by constraining the IF to $f_s/4$ which simplifies, as previously mentioned, the sampled sinusoids used for mixing to sequences of $+1, 0, -1, 0, \ldots$, . This halves the computational costs since there is no need to explicitly filter signal samples that have been multiplied by zero. However, the computational cost is still substantial since two filters are required which may need many coefficients to achieve sufficient accuracy.

Figure 2:
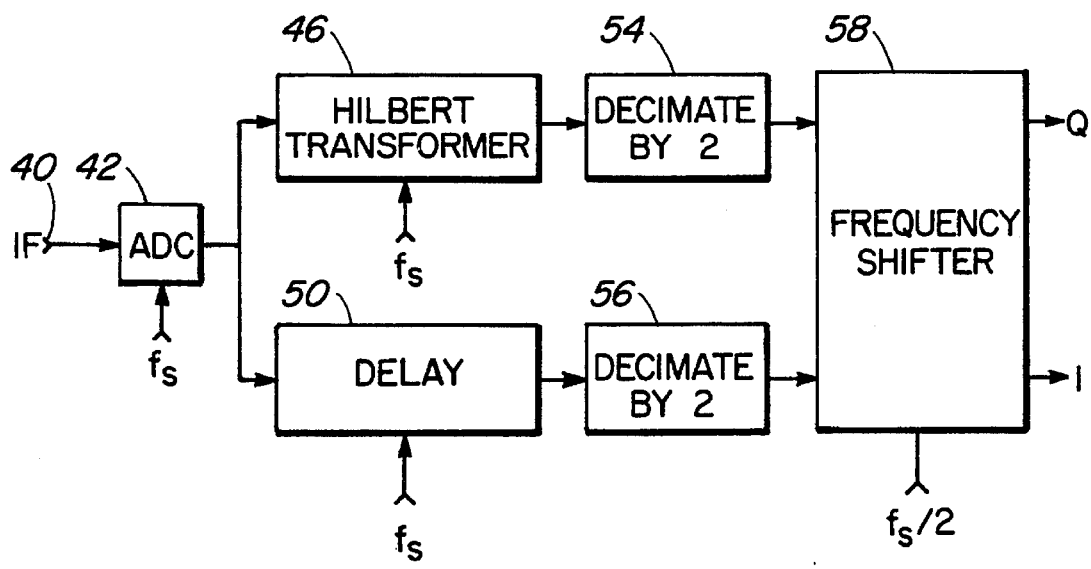
FIG. 2 is a block diagram of a known quadrature demodulator that employs digital signal processing and which is based on the use of a Hilbert transformer.

An alternative approach to digital quadrature demodulation is based on the use of Hilbert transformers such as illustrated in FIG. 2. FIG. 2 shows a practical implementation of the concept described by Rice et al. The analog IF input signal at 40 is converted to digital form by A/D converter 42 having a sampling rate $f_s$ and, in one channel, applied to a Hilbert Transformer 46 which is an allpass filter designed to realize a 90° relative phase shift. Only one filter is required which is operated at the sampling frequency $f_s$ and this can be designed as a symmetric odd length Finite Impulse Response (FIR) filter whose even coefficients are zero. In the other channel (I channel), the samples are applied to a time delay circuit 50, operated at the sampling frequency $f_s$, with a delay period equal to the sampling period. The output of Hilbert Transformer 46 is decimated by 2 at circuit 54 whose output is applied to a frequency shifter 58 to generate the quadrature (Q) signal output. The frequency shifter 58 is operated at a clock rate of $f_s/2$. The output from A/D converter 42 is applied through the time delay circuit 50 to a decimate by 2 circuit 56 whose output is applied to frequency shifter 58 to provide the I signal output. The decimation by 2 in each of the I and Q channels results in an overall decimation by 4.

Figure 3:
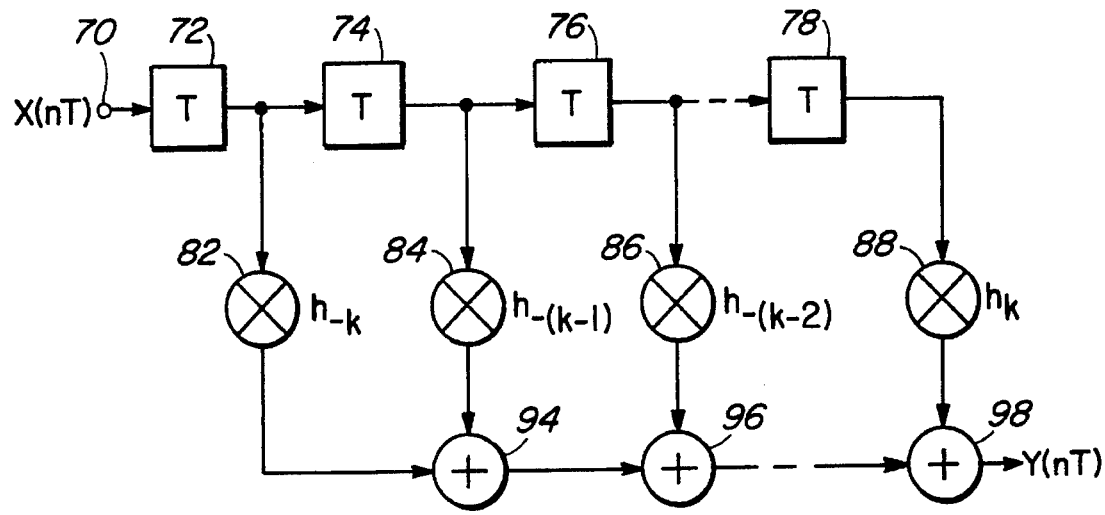
FIG. 3 is a schematic diagram which illustrates the architecture of a direct form Finite Impulse Response (FIR) filter.

A FIR filter can be defined by the equation $$y(nT) = \sum_{k=-K}^{k=K} h_k x((n-k)T) \quad (1)$$

where $x(nT)$ represents the $n^{th}$ input signal sample, T is the sample period and the set of $N=2K+1$ filter coefficients $\{h_{-k}, \ldots, h_{-2}, h_{-1}, h_0, h_1, h_2, \ldots, h_k\}$ is the impulse response of the filter. The quantity $N=2K+1$ is the total number of stages in the filter with k representing each stage and $h_k$ is the filter coefficient for each stage of the filter. A simple direct form realization of this FIR filter is shown in FIG. 3. This FIR filter uses a chain of N clocked registers 72, 74, 76 . . . , 78 to implement a shift register or tapped delay line for a signal $X(nT)$ at input 70 which is applied to the first register 72 as shown in FIG. 3. At a time interval T, the signal sample in each register is shifted to the next register. The output samples $Y(nT)$ from the FIR filter are generated by multiplying the delayed signal sample at the output of each register by the corresponding filter coefficient ($h_k$) in multipliers 82, 84, 86 . . . , 88 and summing the resulting products from the multipliers in a chain of adders 94, 96 . . . , 98. The output of the last adder 98 then provides the desired output $Y(nT)$.

A criticism of the type of architecture shown in FIG. 3 is that the chain or tree of adders 94, 96 . . . , 98 can introduce significant time delays which will adversely affect the maximum clock rate, i.e., the sample rate, unless the adder circuitry is pipelined through the addition of pipeline registers. Considerable work has been undertaken to design FIR filter architectures better suited for high speed operation such as that described by K.H. Cheng et al in an article "VLSI Architectures for the Finite Impulse Response Filter" which appeared in the *IEEE Journal on Selected Areas in Communication*, Vol. SAC-4, No. 1, January 1986. However, relatively little work has been devoted to half-band filters or filters where decimation is employed to reduce the output data rate.

Important design considerations for a digital quadrature demodulators include both performance and implementation issues. Good phase and amplitude accuracy over a large effective bandwidth is required. The delay of the quadrature demodulator should be frequency independent for processing wideband signals. In addition, a large mismatch in the frequency responses of the two channels is undesirable in applications where the signal of interest is typically a sinusoid whose instantaneous frequency is likely to be offset from the IF. Finally, DC offsets from the A/D converter should not affect the quadrature demodulator performance.

The achievable performance for any given bandwidth is dependent on the A/D converter sampling rate, the effective resolution of the A/D converter over the bandwidth occupied by the bandpass IF signal and the accuracy of the quadrature demodulation algorithm. That accuracy is determined by the number of filter coefficients, the resolution of their numerical representation(s) and the design procedure for generating them. There is generally a tradeoff between accuracy and computational cost. Therefore, the reduction in computational cost obtained with any new algorithm is potentially useful in facilitating a practical real-time implementation of a quadrature demodulator.

The major portion of the computational cost of digital quadrature demodulation algorithms is in the memory, multiplication and addition operations required by the filters. Given that a straightforward way of carrying out multiplication is as a sequence of shift and add operations, it is apparent that it is a particularly costly operation. The amount of logic circuitry required to implement a parallel multiplier typically increases with the square of the arithmetic precision required. This relationship will also hold if multiplication is implemented with a lookup table in read only memory (ROM). Consequently, it is desirable to minimize the number of multipliers and their arithmetic precision.

One proposed algorithm for a digital quadrature demodulator is similar to Rader's algorithm, but differs in the choice of filters. The basic concept is to use symmetric FIR inphase and quadrature bandpass filters followed by a decimation by 4. The bandpass output signals from the filters are translated in frequency to baseband as a result of that decimation since the input signal is centred on an IF of $f_s/4$. Since the maximum usable bandwidth is always limited to $f_s/4$ by aliasing, it is logical to select a corresponding filter bandwidth specification. This results in the attenuation of undesired signals separated from the IF by a frequency between $f_s/8$ and $3f_s/8$. The stopband attenuation performance requirements for the analog IF filter are therefore relaxed and DC offsets from the A/D converter suppressed. This choice of bandwidth has the implication that bandpass filters can be derived from a quarter-band lowpass filter prototype. Fractional-band filters are characterized by an odd number of coefficients, a time domain response with even symmetry and have the advantage that a portion of their coefficients are equal to zero. Since the total number of nonzero coefficients of the inphase and quadrature filters is the same as in the prototype quarter-band lowpass filter, most of the coefficients in the two filters are equal to zero.

The design procedure for the fractional-band filters is as follows:

1. Design a quarter-band linear phase Finite Impulse Response lowpass filter with $N=2K+1$ coefficients that the requirement for linear phase results in the symmetry constraint on the filter coefficients that $h_{-k}=h_k$. The constraint that (N–5) is exactly divisible by 8 will ensure that the first and last coefficients of each of the inphase and quadrature filters are nonzero. Any of the standard methods of designing linear phase Finite Impulse Response lowpass filters may be used. It should be noted that there are tradeoffs between the number of coefficients, the width of a passband meeting a given ripple specification and the stopband attenuation.

2. Generate the inphase filter by multiplying the prototype lowpass filter coefficients by $\cos(k\pi/2)$.

3. Generate the quadrature filter by multiplying the prototype lowpass filter coefficients by $\sin(k\pi/2)$.

Figure 4:
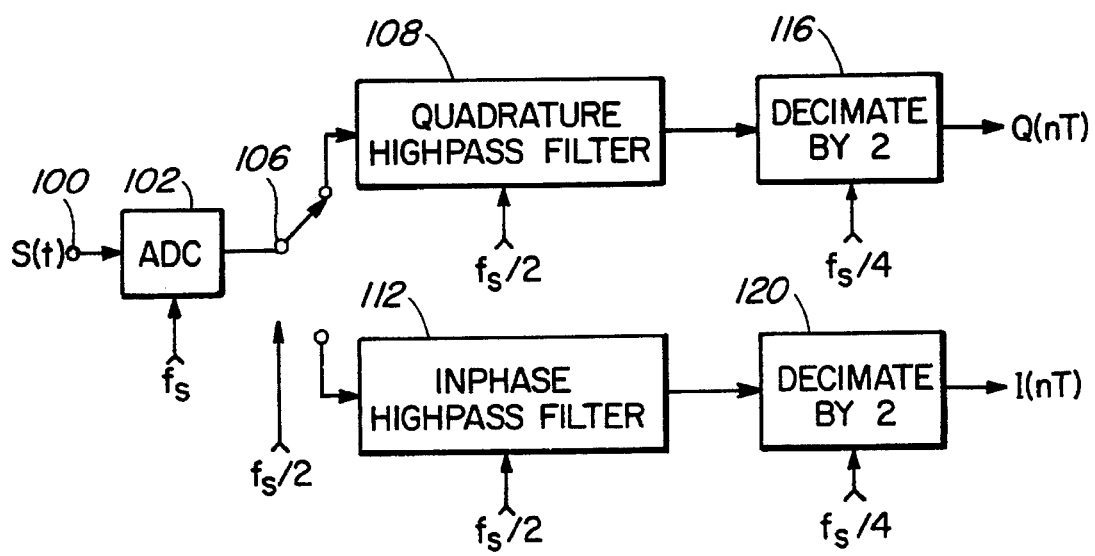
FIG. 4 is a block diagram of a quadrature demodulator according to the present invention.

The above algorithm is computationally efficient since mixing and filtering are combined. Furthermore, no additional filtering is required to eliminate DC offset errors. The total number of nonzero filter coefficients is equal to $(3N+5)/4$. The computational cost in multiplication/second for real-time operation is equal to $(f_s/16)(3N+5)$ since each coefficient only multiplies ¼ of the signal samples generated by the A/D converter because of the decimation operations. This can be further reduced by a factor of nearly 2 if the symmetry of the filter coefficients are exploited. There is still the objection that the useful bandwidth is less than $f_s/4$ rather than $f_s/2$. This is not a serious problem since a bandwidth on the order of 100 MHz can be achieved with the oversampled approach by using currently available analog-to-digital converters providing sampling rates of 500 MHz or more with 8 bit resolution. Consequently, the advantages in computational cost and performance outweigh the drawback of the requirement for a higher sampling rate for a given bandwidth in many applications. Furthermore, the oversampling by 2 has the advantage that the filtering reduces the quantizing noise of the A/D converter by up to 3 dB. A functional implementation of this quadrature demodulator is illustrated in FIG. 4 in which an IF signal s(t) at input 100 is applied to A/D converter 102 and streams of even and odd samples from the A/D converter 102 are separately processed in separate I and Q channels. Those samples are processed by highpass filters, a quadrature highpass filter 108 in the Q channel and an inphase highpass filter 112 in the I channel, derived from the corresponding bandpass filters by deleting the coefficients constrained to zero by the multiplication by $\sin(k\pi/2)$ or $\cos(k\pi/2)$. The even and odd samples are directed to the proper channels by switch 106, operated at a sampling rate $f_s/2$, which is connected to the output of the A/D converter 102 that is operated at a sampling rate $f_s$. The output of filter 108 in the Q channel is decimated by 2 in the circuit 116 which is operated at a sampling frequency $f_s/4$ to provide a quadrature output Q(nT). The output of filter 112 in the I channel is decimated by 2 in the circuit 20 which is operated at a sampling frequency $f_s/4$ to provide an inphase output I (nT). The inphase filter 112 is a half-band filter which still has nearly half its coefficients equal to zero. Typical coefficients for the filters derived from a Hamming windowed 21 coefficient lowpass filter prototype are:

$h_q$={0.0049, 0.0168, –0.0479, –0.1209, 0.4397, –0.4397, 0.1209, 0.0479, –0.0168, –0.0049};

and $h_i$={–0.0048, 0.0, 0.0413, 0.0, –0.2896, 0.5, –0.2896, 0.0., 0.0413, 0.0, –0.0048 }.

Figure 5:
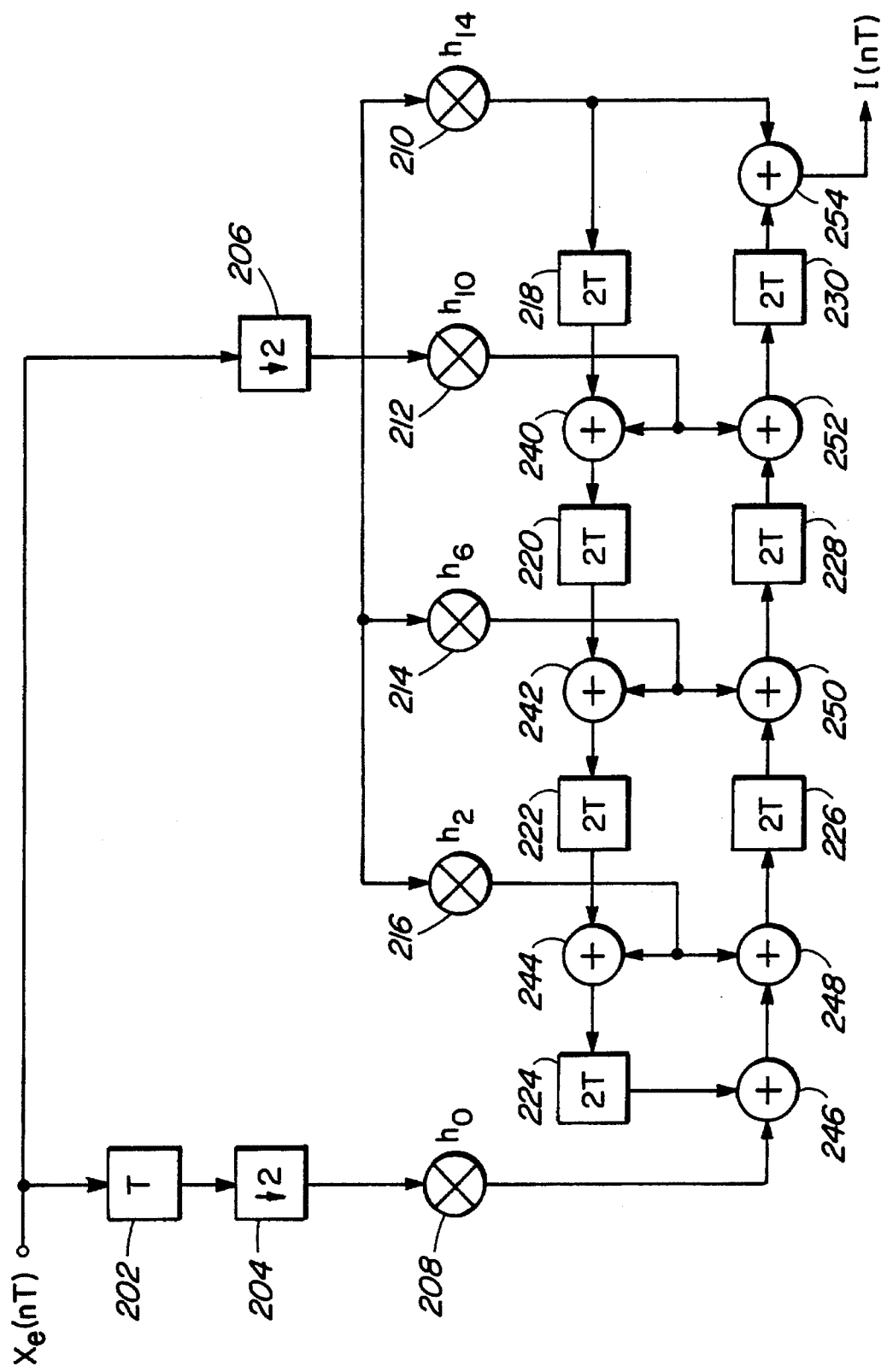
FIG. 5 is a schematic diagram of an optimized transpose form architecture for an inphase filter of a quadrature demodulator according to the present invention.
Figure 6:
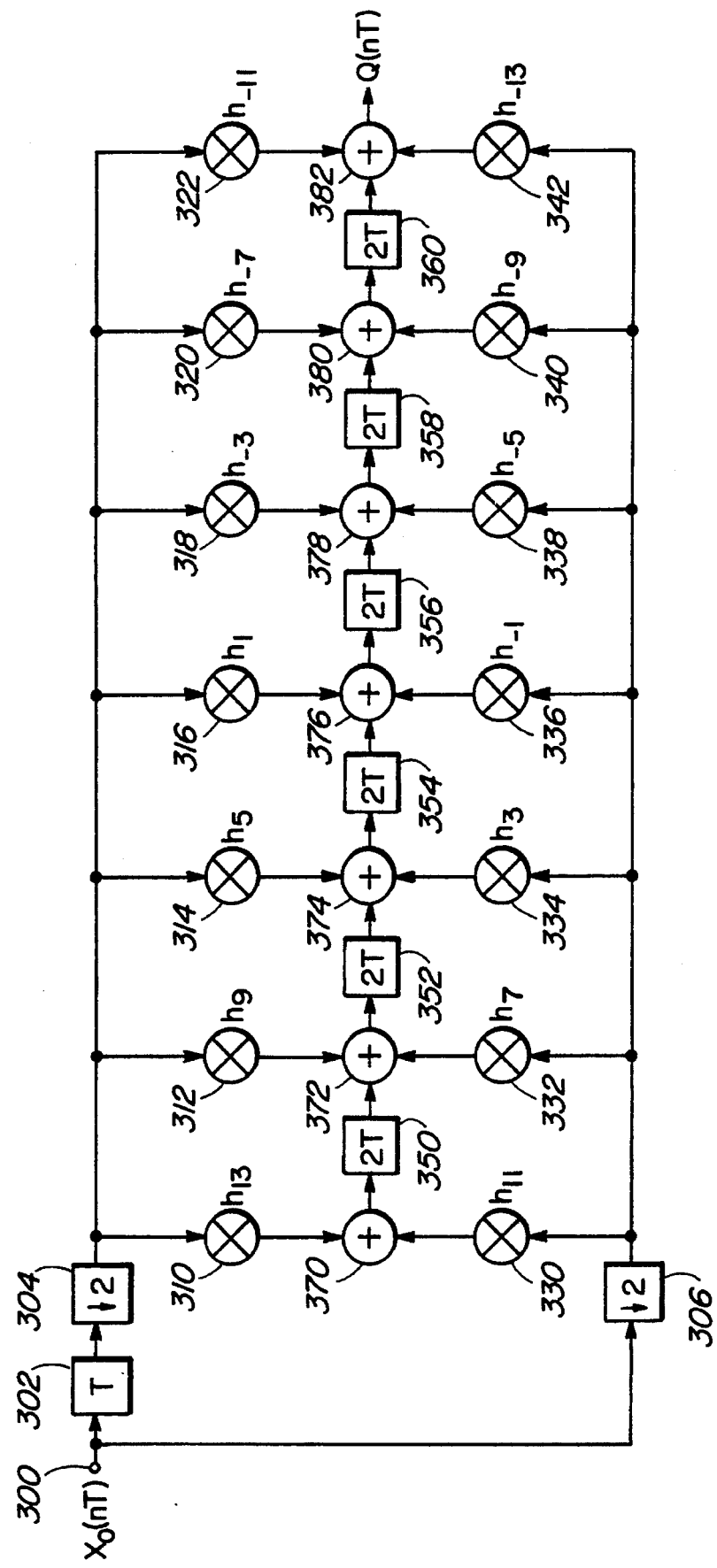
FIG. 6 is a schematic diagram of an optimized transpose form architecture for a quadrature filter of a quadrature demodulator according to the present invention.

Filter architectures, according to the present invention, which efficiently implement the inphase and quadrature filters and the decimate by 4 operation for a similar type of quadrature demodulator as in FIG. 4 are illustrated in FIGS. 5 and 6. The filters in FIGS. 5 and 6, respectively, provide the inphase "I(nT)" and quadrature "Q(nT)" output signals for the digital demodulator. These filters are specialized derivatives of the transpose form filter architecture which has the general advantage of avoiding the need for chains or trees of adders. Consequently, the worse case signal delay paths consist of a multiplier delay +1 or 2 adder (subtracter) delays without the addition of pipeline registers. It should be noted that this result does not depend on the number of filter coefficients. Furthermore, the inphase filter architecture of FIG. 5 makes use of the symmetry of the filter coefficients to nearly halve the number of multipliers.

The optimized transpose form architecture for the inphase filter shown in FIG. 5 has an input signal $X_e(nT)$ of even samples from switch 106 (FIG. 4) applied to its input terminal 200, that input signal being split into two paths, a first path applying that input signal to a first decimate by 2 circuit 206 and the second path applying the input signal through a first time delay circuit 202, having a time delay T equal to the sample period, followed by a second decimate by 2 circuit 204. The decimate by 2 circuits 206 and 204 are registers clocked at intervals of 2T. The output from circuit 206 in the first path is applied, in parallel, to a number of multiplier circuits 210, 212, 214 and 216 which multiply the signal from 206 by a filter coefficient $h_n$, each multiplier having a particular filter coefficient associated with it. In FIG. 5, as illustrated, the signal from 206 is multiplied by the filter coefficient $h_{14}$ at multiplier 210, by $h_{10}$ at multiplier 212, by he at multiplier 214, by $h_2$ at multiplier 216 and, in the second path, the signal from the second decimate by 2 circuit 204 is multiplied by $h_0$ at multiplier 208. These filter coefficients are the even coefficients of the prototype filter. The outputs from each of the multipliers 212, 214, and 216 are applied to the inputs of a pair of adders, one of the adders in each pair being located in a third path of the filter and the other adder in each pair being located in a fourth path.

An output from the first multiplier 210, which multiplies a signal by a filter coefficient $h_{14}$, is applied to the input of a second time delay circuit 218, in the third path, having a time delay 2T. The output from the delay circuit 218 is applied to a first adder 240 in the third path, the other input of the first adder 240 being supplied with a signal from the output of the second multiplier 212 which multiplies its input by a filter coefficient $h_{10}$. The output of the second multiplier 212 is also applied to an input of another adder 252 in the fourth path, the adders 240 and 252 forming a first pair of adders. The output from the first adder 240 is applied to the input of a third time delay circuit 220 having a delay period of 2T and whose output is applied to one input of a second adder 242 in the third path. That second adder's other input being supplied with a signal from the output of the third multiplier 214 which multiplies its input with a filter coefficient $h_6$, the third multiplier's output being also supplied to an input of an adder 250 in the fourth path. Adders 242 and 250 form a second pair of adders which are associated with multiplier 214. In a similar manner to the connections for the first adder, the output from the second adder 242 is applied to a further (fourth) time delay circuit 222, having a delay 2T, whose output is applied to an input of a further (third) adder 244 in the third path. The output from the fourth multiplier 216, which multiplies its input by a filter coefficient $h_2$, is applied to the other input of the third adder 244 in the third path and also to the input of an adder 248 in the fourth path. Adders 244 and 248 form a third pair of adders associated with multiplier 216. The output from that third adder 244, in the third path, is applied to the input of a still further (fifth) time delay circuit 224 which has a time delay 2T.

In the second path for the input signal of the circuit shown in FIG. 5, the output from the second decimate by 2 circuit 204 is applied to a fifth multiplier 208 which multiplies its input signal by the filter coefficient $h_0$ and that fifth multiplier's output is applied to the input of a fourth adder 246 whose other input is supplied with a signal from the output of the last (fifth) time delay circuit 224 in the third path. The output of adder 246 is then applied to an input of an adder 248 (fifth adder) in the fourth path, the other input of adder 248 being supplied with the output of the fourth multiplier 216 which multiplies its input by the filter coefficient $h_2$. The output from that fifth adder 248 is applied through a 2T time period delay circuit 226 to an input of another (sixth) adder 250 in the fourth path, the other input of adder 250 being supplied with the output of the third multiplier 214 (filter coefficient $h_6$) which is also applied as an input to adder 242 in the third path. The output of the sixth adder 250 is applied through a 2T time period delay circuit 228 (seventh time delay circuit) to an input of another (seventh) adder 252 whose other input is supplied with a signal from the output of the second multiplier 212 (filter coefficient h0) which is also applied to an input of adder 240 in the third path. The output from the seventh adder 252 is then applied through a 2T time period delay circuit 230 in the fourth path to a last (eighth) adder 254. That eighth adder's other input is supplied with an output signal from the first multiplier circuit 210 (filter coefficient $h_{14}$) to provide, at the output of adder 254, the demodulated inphase signal I(nT). The filter coefficients are the even coefficients of the prototype filter.

The output signal data is generated by multiplying the signal samples by the filter coefficients, delaying the resultant products by the appropriate delays and summing them together. There are several differences between this circuit and the one shown in FIG. 3. First, the delay operations are performed after the input signal samples are multiplied by the filter coefficients. Second, since only alternate output samples are required as a result of the decimation operations carried out by block 120 in FIG. 4, the filter has been designed so that only the operations required to produce the output data samples remaining after decimation are performed. Consequently, operations are performed at the output data rate which is half of the input data rate, i.e., at intervals of 2T.

In the operation of the circuit, the input signal is divided between the first and second path and the delay circuit 202 causes the input data to be split into two streams of data with a relative delay of T, i.e., one sample period. The decimation circuits simultaneously select data samples at half of the input data rate, i.e., at intervals of 2T between samples from each of the two streams of data. As a result each decimator circuit passes half of the input signal samples. Each signal sample from decimator circuit 206 is multiplied by filter coefficients $h_k$ where k−2 is evenly divisible by 4, i.e., $h_2$, $h_6$, $h_{10}$ and $h_{14}$. Since $h_k=h_{-k}$ it is only necessary to consider coefficients for which k is 0. Similarly, the output of decimator circuit 204 is multiplied by the filter coefficients $h_k$ where k is evenly divisible by 4 and $h_k$16 0, i.e., $h_0$. Note that it would be necessary to multiply each signal sample by all of the filter coefficients if the output data rate were not halved by decimation operations. To generate the output signal data, each result of the multiplication of a signal sample and filter coefficient is delayed by the appropriate multiple of 2T and the delayed results summed. Note that each result must be delayed by two different delays since the same result is used for h and $h_{-k}$. The delay and sum operations are done using the shift register constructed of delay circuits 218 to 230 and adders 240 to 254. Data applied to the input of an adder is summed to the data from the preceding delay circuit and the resultant sum is transferred into the next delay circuit at intervals of 2T. The delay provided by the shift register to a given data sample is the number of delay circuits through which the data passes multiplied by 2T.

The optimized transpose form architecture for the quadrature filter shown in FIG. 6 has an input signal $X_o(nT)$ of odd samples from switch 106 (FIG. 4) applied to its input terminal 300, that signal being split into two separate parallel paths. In the first path, the input signal $X_o(nT)$ is delayed by a time period T in delay circuit 302 and then applied to a decimate by 2 circuit 304. However, the input signal $X_o(nT)$ is applied directly to a decimate by 2 circuit 306 in the second path. The output signal from circuit 304 in the first path is applied, in parallel, to inputs of a number of multiplier circuits 310, 312, 314, 316, 318, 320 and 322 where that signal is multiplied by filter coefficients $h_{13}$ at 310, $h_9$ at 312, $h_5$ at undelayed output signal from circuit 306 in the second path is applied, in parallel, to inputs of a number of multiplier circuits 330, 332, 334, 336, 338, 340 and 342 where that signal is multiplied by filter coefficients $h_{11}$ at 330, $h_7$ at 332, $h_3$ at 334, $h_{-1}$ at 336, $h_{-5}$ at 340 and $h_{-13}$ at 342. It should be noted that, except for a sign change, the filter coefficients for multipliers 310 up to 322 are the mirror image of the ones for multipliers 330 to 342, i.e., the coefficient for multiplier 310 is the negative of the coefficient for multiplier 342, the one for multiplier 312 is the negative of the one for multiplier 340, etc.

The outputs from the first multiplier circuit 310 (coefficient $h_{13}$) in the first path and second multiplier circuit 330 (coefficient $h_{11}$) in the second path are applied to the inputs of a first adder 370 whose output is applied, via a 2T time delay circuit 350, to the input of a second adder 372. The output from the second multiplier 312 (coefficient $h_9$) in the afirst path and second multiplier 332 (coefficient $h_7$) in the second path are applied to the inputs of the second adder 372 whose output is applied, via a 2T time delay circuit 352, to a third adder 374. The output from the third multiplier 314 (coefficient $h_5$) in the first path and third multiplier 334 (coefficient $h_3$) in the second path are applied to the inputs of that third adder 374 whose output is applied, via a 2T delay circuit 354, to an input of a fourth adder 376. The output of the fourth multiplier 316 (coefficient h) in the first path is applied to an input of forth adder 376 and the output from the fourth multiplier 336 (coefficient $h_{-1}$) in the second path is applied to an input of the fourth adder 376 whose output is applied, via a 2T time delay circuit 356, to the input of a fifth adder 378. The outputs from the fifth multiplier 318 (coefficient $h_{-3}$) in the first path and fifth multiplier 338 (coefficient $h_{-5}$) in the second path are applied to the inputs of that fifth adder 378 whose output is applied, via a 2T time delay circuit 358, to an input of a sixth adder 380. The outputs from the sixth multiplier 320 (coefficient $h_{-7}$) in the first path and sixth multiplier 340 (coefficient $h_{-9}$) in the second path are applied to the inputs of the sixth adder 380 whose output is applied, via a 2T time delay circuit 360 to an input of a seventh (last) adder. The outputs from the seventh multiplier 322 (coefficient $h_{-11}$) in the first path and the seventh multiplier 342 (coefficient h.) in the second path are applied to the inputs of the seventh adder 382 whose output provides the quadrature signal Q(nT) from the quadrature filter of FIG. 6. The three input adder circuits consist of a two input adder whose output is connected to one of the two inputs of an adder.

The operation of the circuit differs from that of the inphase filter shown in FIG. 5 for several reasons. First the number of coefficients is even. Second, none of the coefficients have values of zero. In the operation of the circuit, the input signal is divided between the first and second paths and the delay circuit 302 causes the input data to be split into two streams of data with a relative delay of T, i.e., one sample period. The decimation circuits simultaneously select data samples at half of the input data rate, i.e., at intervals of 2T between samples from each of the two streams of data. As a result each decimator circuit passes half of the input signal samples. Each signal sample from decimator circuit 306 is multiplied by filter coefficients $h_k$ where k+1 is evenly divisible by 4, i.e., $h_{11}h_7$, $h_3$, $h_{-1}$, $h_{-5}$, $h_{-9}$, and $h_{-13}$. Similarly, each sample from decimator circuit 304 is multiplied by filter coefficients $h_k$ where k-1 is evenly divisible by 4, i.e., $h_{13}$, $h_9$, $h_5$, $h_1$, $h_{-3}$, $h_{-7}$, and $h_{-11}$. To generate the output signal data, each result of a multiplication of a signal sample and filter coefficient is delayed by an appropriate multiple of 2T and added together. This is done using the shift register constructed of delay circuits 350 to 360 and adders 370 to 382. Data applied to the input of an adder is summed to the data from the preceding delay circuit and the resultant sum is transferred into the next delay circuit at intervals of 2T. The delay provided by the shift register to a given data sample is the number of delay circuits through which the signal passes multiplied by 2T.

Figure 7:
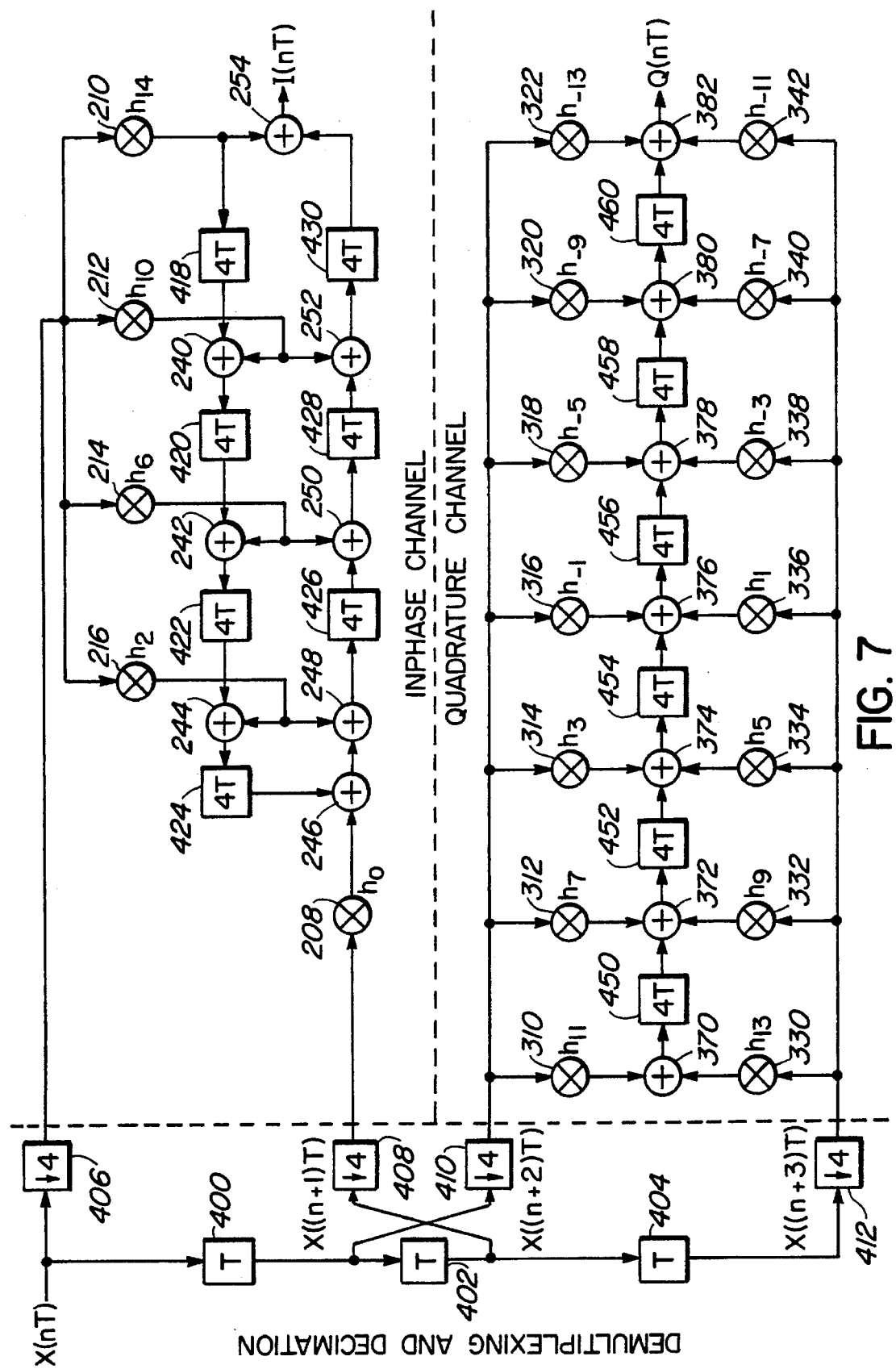
FIG. 7 is a schematic diagram of the quadrature demodulator containing the inphase and quadrature filters connected for proper operation according to another embodiment of the present invention.

FIG. 7 shows how the transpose form I and Q filters can be efficiently connected to properly perform quadrature demodulation. In this particular implementation, the minimum delay T is $1/f_s$ rather than $2/f_s$ as in the circuits of FIGS. 5 and 6 since both odd and even samples from the A/D converter are being processed. Consequently, delay circuits that had a delay of 2T in FIGS. 5 and 6 are shown with a delay of 4T in FIG. 7 and identified by numerals raised by 200 over the ones in FIGS. 5 and 6, i.e., time delay circuit 218 in FIG. 5 is identified by the number 418 in FIG. 7. The switch 106 in FIG. 4 and the delay and decimation circuits 202, 204, 206, 302, 304, and 306 in FIGS. 5 and 6 are replaced by delay circuits 400, 402, 404 and decimation by 4 circuits 406, 408, 410 and 412, the last four circuits forming first, second, third and fourth decimate by 4 circuits, respectively, in FIG. 7. The sampled and digitized signal data X(nT) is applied to the inputs of the first delay circuit 400, which provides a delay T, and a first decimate by 4 circuit 406. The output of delay circuit 400 is applied to the third decimate by 4 circuit 410 and a second delay circuit 402 which provides an additional delay T. The output of delay circuit 402 is applied to the second decimate by 4 circuit 408 and a third delay circuit 404 which provides an additional delay T. The output of the third delay circuit 404 is applied to the fourth decimation by 4 circuit 412. The output signals from each of the decimation by 4 circuits is a sequence of data samples at time intervals of 4T (i.e., frequency $f_s/4$). The data samples output by the four decimation by 4 circuits have a relative offset in time of 0 (output of the first decimation by 4 circuit 406), T (output of the third decimation by 4 circuit 410), 2T (output of the second decimation by 4 circuit 408) and 3T (output of the fourth decimation by 4 circuit 412). The outputs from the two decimate by 4 circuits 406 and 408 provide inputs to first and second paths, respectively, of an inphase filter similar to the type shown in FIG. 5. The outputs from the two decimate by 4 circuits 410 and 412 provide inputs to first and second paths, respectively, of a quadrature filter similar to the type shown in FIG. 6. The output of decimation by 4 circuit 406 is applied to the inputs of multipliers 210, 212, 214, and 216 in the first path of the inphase channel and the output of decimation by 4 circuit 408 is applied to the input of multiplier circuit 208 in the second path. The multipliers 210, 212, 214, 216 and 208 are the same as those shown for the inphase filter illustrated in FIG. 5. The output of the third decimation by 4 circuit 410 is connected to the inputs of multipliers 310, 312, 314, 316, 318, 320, and 322 in the first path of the quadrature channel. These are the same as the multipliers in the first path of the quadrature filter shown in FIG. 6. The output of the fourth decimation by 4 circuit 412 is applied to the inputs of multipliers 330, 332, 334, 336, 338, 340, and 342 in the second path of the quadrature channel. These multipliers are the same as those in the second path of the quadrature filter shown in FIG. 6. The connections between the multipliers and the remaining circuits of FIG. 7 are the same as those for the inphase and quadrature filters shown in FIGS. 5 and 6 with the exception that each of the delay circuits 418 to 430 in the inphase channel and delay circuits 450 to 460 in the quadrature channel of FIG. 7 provide a time delay of 4T, rather than a 2T time delay provided by the delay circuits in FIGS. 5 and 6.

The operation of the inphase and quadrature channels is similar to the operation of the inphase and quadrature filters of FIGS. 5 and 6 except that the Demultiplexing and Decimation block performs the functions of decimation circuits 204, 206, 304, and 306, and delay circuits 202 and 302 in FIGS. 5 and 6. The Demultiplexing and Decimation block also introduces a delay of T between the inphase and quadrature channels which permits the delay and decimation circuits to be controlled by a single clock signal of period 4T. In the operation of the Decimation and Demultiplexing block, the input signal data at a sample rate 1/T is successively delayed by increments of T to result in versions delayed by 1, 2 and 3 T. This is done by a shift register constructed of delay circuits 400 to 404. At intervals of T, each delay circuit stores and outputs the data present at its input, i.e., the data stored in each delay circuit is transferred to the next one. At intervals of 4T, each decimator circuit selects the current input signal sample and passes it on. Consequently, there are 4 streams of data samples produced, each having a rate of ¼T.

This architecture shown in FIG. 7 has the desirable property that most circuits are clocked with a period 4T (i.e., ¼$f_s$ or the output data rate) and only the, delay circuits 400, 402, and 404 need be clocked with the minimum period T (i.e., $1/f_s$). The architecture is therefore well suited for implementation as a VLSI circuit. In a VLSI circuit, it is generally desirable for economic reasons to employ a single type of logic circuit such as emitter coupled logic (ECL) or complementary metal oxide semiconductor (CMOS) logic. This results in complex circuits such as multipliers and adders being slower than simple circuits such as D type flip flops (i.e., delay and decimation circuits). In the type of architecture shown in FIG. 7, only the delay circuits must operate at a high speed (clock rate $f_s$) and the arithmetic circuits can operate with a throughput rate of only $f_s/4$ (if the decimation and delay circuits are assumed to be infinitely fast). Another consideration is that the problem of generating and distributing clocks with minimal relative time skews is simplified since only 2 clocks (at $f_s$ and $f_s/4$) are required to implement a practical circuit.

The quadrature demodulation approach using quadrature highpass filters, according to the present invention, requires (3N+5)/4 nonzero filter coefficients where N is the order of the prototype lowpass filter. Reasonable compromise values of N are 21, 29, 37 or 45. The bandwidth and stopband attenuation are severely reduced for lower values of N whereas there is little performance improvement compared with the increase in computational cost for larger values of N. Consequently, for a parallel architecture as shown in FIG. 3, a minimum of 17 multipliers would be required when N=21. A further reduction of the number of multipliers by a factor of nearly 2, i.e., to 9 for N=21 or 14 for N=29, can be achieved by making use of the symmetry properties of the filter coefficients. This approach is implemented in the inphase filter architecture shown in FIG. 5, but is unsuitable for the transpose form architecture as shown in FIG. 6. However, this limitation of the filter architecture shown in FIG. 6 is offset since it requires 7 fewer registers than other implementations which do not use the transpose form architecture. It is also possible to eliminate one of the two multipliers 316 and 336 associated with filter coefficient h and h in FIG. 6 by first subtracting the signal sample from decimation by 2 circuit 306 from the signal sample from decimation circuit 304, multiplying the resulting signal sample by coefficient $h_1$ and applying the result to a single two input adder which replaces the adder 376.

In most parallel hardware implementations of digital filters, the multipliers account for most of the logic circuitry. The amount of circuitry required to implement the multipliers in a digital filter is dependent on the arithmetic precision of the signal data and filter coefficients as well as the number of filter coefficients. Many filter design procedures produce floating point representations of the filter coefficients. However, these would be very expensive to implement in hardware. Consequently, it is usual practice to convert the filter coefficients to a fixed point binary representation for use in parallel hardware digital filters even though the performance is affected by the precision of the fixed point representation. Rounding usually results in sub-optimal filter coefficients and better results can be obtained using iterative search techniques to optimize the set of quantized filter coefficients such as the iterative search approach described by H. Samueli in "The Design of Multiplierless Digital Data Transmission Filters with Powers of Two Coefficients" at the Proceedings of IEEE Telecommunications Symposium" on Sep. 3–6, 1990.

Design requirements which result in the use of a substantial number of multipliers in a quadrature demodulator have undesirable implications for the size, cost and power consumption for any VLSI implementations of that design. An important concept of the present invention is that certain quadrature filters having good performance specifications can be designed with the result that most of the filter coefficients can be represented by fractional powers of 2. This would, as a result, simplify the multiplication of signed magnitude binary data to a fixed shift of the magnitude component and, depending on the sign of the coefficient, complementing the sign bit.

The design methodology for obtaining the simplified filter coefficients according to the present invention involves an iterative search procedure similar to Samueli, but which differs in several important respects. Samueli applied his procedure to the problem of optimizing the performance of a single filter in terms of its passband and stopband ripple. Here, the goal is to optimize the performance of the pair of filters used to implement a digital quadrature demodulator, and the error is measured in terms of the phase error obtained indirectly as a measure of the mismatch in the frequency responses of the two filters. The procedure involves a number of steps, a first of which has been described. Those steps are as follows:

1. Derive a set of floating point quadrature and inphase filter coefficients from a quarter-band prototype lowpass filter designed using a standard filter design procedure. Results are presented herein obtained with sets of coefficients derived from a linear phase prototype lowpass filter obtained by the Fourier transformation of the frequency response of an ideal quarter-band lowpass filter and truncating the resultant time domain impulse response using a Hamming window. Other windows or alternative design procedures might be used with small differences resulting in the performance and complexity of the simplified coefficients. Some alternative design procedures are described by L. R. Rabiner et al in "Theory and Application of Digital Signal Processing", Prentice-Hall, Englewood Cliffs, New Jersey, 1975.

2. New sets of scaled and quantized filter coefficients are then obtained. First scaled sets of filter coefficients are obtained by multiplying the set of floating point filter coefficients $\{h_k\}$, $k\epsilon\{-K, -(K-1), \ldots, 0, \ldots, K-1, K\}$ obtained in step 1 by scale factors uniformly distributed over the range from 0.5 to 1. The use of scale factors outside this range would result in sets of coefficients that differ only by powers of 2 and would be redundant. The scale factor would typically be incremented in steps whose size is selected to result in a number of steps equal to $I=2^M$ where M is the maximum number of bits allowed for the signed magnitude binary representation of the final filter coefficients. The set of $2^M$ scale factors that result from this choice is $\{0.5+2^{-(M+1)}, 0.5+2(2^{(-M+1)}), 0.5+3(2^{-(M+1)}), \ldots, 1\}$. The $2^M$ scaled sets of filter coefficients are next converted to signed magnitude binary form and rounded to generate scaled and quantized sets of filter coefficients $\{h_k\}_i$, $i\epsilon\{1, 2, \ldots, 2^M\}$. The effect of a scaling operation is to change the gain of both filters. The change in gain is usually unimportant or if necessary can be corrected by appropriately scaling the output signals from the filters. The effect of rounding is to introduce quantization errors in the filter coefficients. The distribution of the quantization errors among the filter coefficients and their effect on the behaviour of the filters depends on the scaling factor and the resolution selected for the rounding. The resolution to which the rounding is performed depends on the desired accuracy. In practical systems this will usually be dependent on the number of bits number of bits used to represent the signal data. For signal data quantized to 8 or 9 bit resolution, it was found by empirical tests that good results were obtained with filter coefficients rounded to 9 bit resolution. This precision provided a good compromise between performance and the computational cost of the filter coefficients. In general, for signal data quantized to L bit resolution, reasonable choices of M to consider are M=9 for L=9 and M$\epsilon$\{L, L+1, L+2\} for L≦9.

3. The sets of scaled and rounded filter coefficients $\{h_k\}_i$ are used to construct $2^M$ sets of quadrature demodulation filters. The set of inphase filter coefficients $\{h_{Ik}\}_i$ is obtained by multiplying the scaled prototype lowpass filter coefficients $\{h_k\}_i$ by $\cos(k\pi/2)$ and deleting the terms with odd values of k. The corresponding set of quadrature filter coefficients $\{h_{Qk}\}_i$ is obtained by multiplying the prototype lowpass filter coefficients $\{h_k\}_i$ by $\sin(k\pi/2)$ and deleting the terms with even values of k. The performance of each of the $2^M$ pairs of quadrature demodulator filters is evaluated. The performance measure consists of the peak phase error expected from the mismatch of the frequency responses of the two filters over the quadrature demodulator bandwidth.

This could be directly measured by performing quadrature demodulation on a simulated sinusoidal signal, computing the phase data from the inphase and quadrature data and determining the phase error as the difference between the phase data and a straight line that has been fitted to the phase data. However, a similar result can be obtained from the peak phase error computed using the bound $|H_q(f_p)|/|H_i(f_p)|-\pi/4]$ where $|H(f_p)|$ is the amplitude of a filter output signal for a unit amplitude sinusoid of frequency $f_p$. The performance measure is obtained using a set of discrete values of $f_p$ distributed over the usable quadrature demodulator bandwidth which ranges from $f_s/8$ to $3f_s/8$, but a different bandwidth for a specific application could be used. An alternative performance measure would be to use the mean square value of the peak phase error given by $[\arctan |H_q(f_p)|/|H_i(f_0)|-\pi/4]$ for discrete values of $f_p$ distributed through the bandwidth of interest. The sets of filter coefficients for the modified prototype filters having the best performance measure are selected for subsequent processing in step 4. It has been found that the phase error obtained using sets of filter coefficients resulting from the scaling and rounding operations is often significantly better than the performance that would be obtained if rounding were performed without the scaling operations. If the scaling and rounding operations are performed for different resolutions, it is often found that there is an optimum resolution which provides the best phase error performance. A significant improvement over the performance provided by the unrounded filter coefficients can be obtained. For example, the peak phase error obtained for a 29 coefficient prototype filter designed using the Hamming window method is approximately 0.12 degree if a floating point representation of the filter coefficients is used. This is reduced to approximately 0.079 degree after scaling and rounding to 10 bit resolution is performed.

4. The sets of filter coefficients selected after evaluation in step 3 are optimized by an iterative search procedure. This is applied to the coefficients of the prototype filter for which $k \geq 0$ since it is necessary to maintain the symmetry of the impulse response and this is ensured by always setting $\{h_{-k}\}=\{h_k\}$. The search procedure is applied to each set of scaled and rounded filter coefficients selected after evaluation in step 3 and results in a new set of coefficients for which the performance measure is as good or better than that obtained with the old set of filter coefficients. For each possible pair of nonzero members, $\{h_a, h_b\}$ where $a \neq b$, of a set of filter coefficients $\{h_k\}$, eight modified sets of filter coefficients for the prototype filter are constructed by changing one or both members of the pair by ±1 least significant bit. The possible changes are (+1,+1), (+1,0), (0,+1), (+1,−1), (−1,+1), (−1,0), (0,−1), and (−1,1). This process is repeated for all possible pairs of coefficients $\{h_a, h_b\}$. A pair of I and Q filters are constructed from each of the modified sets of filter coefficients. The I filter is obtained by multiplying the modified prototype lowpass filter coefficients $\{h_k\}_i$ by $\cos(k\pi/2)$ and deleting the terms with odd values of k. The corresponding set of Q filter coefficients $\{h_{Qk}\}_i$ is obtained by multiplying the prototype lowpass filter coefficients $\{h_k\}_i$ by $\sin(k\pi/2)$ and deleting the terms with even values of k. The frequency responses for each new pair of I and Q filters is computed and used to determine the performance measure as in step 3.

5. The best pair of filters (i.e., the pair of filters with the smallest mismatch in their frequency responses) is identified. If it has a better (i.e., smaller) performance measure than obtained for the unmodified set of coefficients, step 4 is repeated using the modified prototype filter coefficients corresponding to the best pair of filters. If no improvement results, the process is stopped and the set of filter coefficients for which the best performance was achieved is selected.

6. The search procedure described in steps 4 and 5 is repeated for the most promising scale factors identified in step 3 and a family of optimized sets of filter coefficients generated. The best overall set of coefficients is selected using the frequency mismatch criterion and/or other criteria such as frequency response ripple in pass and/or stopbands and the complexity of hardware required to implement the filter coefficients. The last can be measured by counting the number of nonzero digits required to represent the filter coefficients.

A modification in step 4 to give more weight on the complexity of the hardware is to ignore modified sets of filter coefficients which have more nonzero digits than the coefficients of the prototype filter from which the modified filters were derived if the modified filter coefficients are smaller in magnitude than a threshold that is set empirically.

Additional optimized sets of filter coefficients can be generated by repeating the procedure for prototype lowpass filters with different numbers of coefficients. However, there will be a tradeoff between performance and computational cost since the attainable performance increases with the number of filter coefficients.

This design methodology for quadrature demodulation filters provides an important and novel result in that a particularly good compromise between computational cost and performance can be obtained using sets of filter coefficients derived from a 29 coefficient prototype lowpass filter. In these sets of coefficients all but a few coefficients can be represented by a single fractional power of 2. Therefore, the number of multipliers required to implement a practical design for a quadrature demodulator can be greatly reduced. Furthermore, in this design methodology, the sets of filter coefficients can be generated by software programs which can also carry out a selection process for the best filter coefficients.

Four sets of coefficients for the inphase and quadrature filters are given in the following Tables 1 to 4.

TABLE 1

Quantized Filter coefficients - Set 1

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $-2^{-7}$ |
| $h_{-12}, h_{12}$ | 0.00000000 | |
| $h_{-11}, h_{11}$ | −0.01562500 | $-2^{-8}$ |
| $h_{-10}, h_{10}$ | −0.02724375 | $-2^{-5} + 2^{-8}$ |
| $h_{-9}, h_9$ | 0.02724375 | $2^{-5} - 2^{-8}$ |
| $h_{-8}, h_8$ | 0.000000000 | |
| $h_{-7}, h_7$ | 0.06250000 | $2^{-4}$ |
| $h_{-6}, h_6$ | 0.125 | $2^{-3}$ |
| $h_{-5}, -h_5$ | −0.12109375 | $-2^{-3} + 2^{-8}$ |
| $h_{-4}, h_4$ | 0.00000000 | |
| $h_{-3}, -h_3$ | −0.24609375 | $-2^{-2} + 2^{-8}$ |
| $h_{-2}, h_2$ | −0.558593750 | $-2^{-0} - 2^{-4} + 2^{-8}$ |
| $h_{-1}, -h_1$ | 0.820312500 | $2^{-1} + 2^{-2} + 2^{-4} + 2^{-7}$ |
| $h_0$ | 0.921875000 | $2^{-0} - 2^{-4} - 2^{-6}$ |

TABLE 2

Quantized Filter coefficients - Set 2

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $−2^{-7}$ |
| $h_{-12}, h_{12}$ | 0.00000000 | |
| $h_{-11}, h_{11}$ | −0.01562500 | $−2^{-8}$ |
| $h_{-10}, h_{10}$ | −0.03125000 | $−2^{-5}$ |
| $h_{-9}, h_9$ | 0.03125000 | $2^{-5}$ |
| $h_{-8}, h_8$ | 0.000000000 | |
| $h_{-7}, h_7$ | 0.06250000 | $2^{-4}$ |
| $h_{-6}, h_6$ | 0.125 | $2^{-3}$ |
| $h_{-5}, -h_5$ | −0.125 | $−2^{-3}$ |
| $h_{-4}, h_4$ | 0.00000000 | |
| $h_{-3}, -h_3$ | −0.25781250 | $−2^{-2} − 2^{-7}$ |
| $h_{-2}, h_2$ | −0.57812500 | $−2^{-1} − 2^{-4} − 2^{-6}$ |
| $h_{-1}, -h_1$ | 0.84375000 | $2^0 − 2^{-3} − 2^{-5}$ |
| $h_0$ | 0.94921875 | $2^0 − 2^{-5} − 2^{-6} − 2^{-8}$ |

TABLE 3

Quantized coefficients - Set 3.

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $−2^{-7}$ |
| $h_{-12}, h_{12}$ | 0.00000000 | |
| $h_{-11}, h_{11}$ | −0.015625000 | $−2^{-8}$ |
| $h_{-10}, h_{10}$ | −0.03125000 | $−2^{-5}$ |
| $h_{-9}, h_9$ | 0.03125000 | $2^{-5}$ |
| $h_{-8}, h_8$ | 0.000000000 | |
| $h_{-7}, h_7$ | 0.06250000 | $2^{-4}$ |
| $h_{-6}, h_6$ | 0.125 | $2^{-3}$ |
| $h_{-5}, -h_5$ | −0.125 | $−2^{-3}$ |
| $h_{-4}, h_4$ | 0.00000000 | |
| $h_{-3}, -h_3$ | −0.25000000 | $−2^{-2}$ |
| $h_{-2}, h_2$ | −0.55078125 | $−2^{-1} − 2^{-5} − 2^{-6} − 2^{-8}$ |
| $h_{-1}, -h_1$ | 0.8046875 | $2^0 − 2^{-3} − 2^{-4} − 2^{-7}$ |
| $h_0$ | 0.90625 | $2^0 − 2^{-3} + 2^{-5}$ |

TABLE 4

Quantized Filter Coefficients - Set 4

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $−2^{-7}$ |
| $h_{-12}, h_{12}$ | 0.00000000 | |
| $h_{-11}, h_{11}$ | −0.015625000 | $−2^{-8}$ |
| $h_{-10}, h_{10}$ | −0.03125000 | $−2^{-5}$ |
| $h_{-9}, h_9$ | 0.03125000 | $2^{-5}$ |
| $h_{-8}, h_8$ | 0.000000000 | |
| $h_{-7}, h_7$ | 0.06250000 | $2^{-4}$ |
| $h_{-6}, h_6$ | 0.125 | $2^{-3}$ |
| $h_{-5}, -h_5$ | −0.125 | $−2^{-3}$ |
| $h_{-4}, h_4$ | 0.00000000 | |
| $h_{-3}, -h_3$ | −0.25000000 | $−2^{-2}$ |
| $h_{-2}, h_2$ | −0.56250000 | $−2^{-1} − 2^{-4}$ |
| $h_{-1}, -h_1$ | 0.83593750 | $2^0 − 2^{-3} − 2^{-4} − 2^{-7}$ |
| $h_0$ | 0.94921875 | $2^0 − 2^{-5} − 2^{-6} − 2^{-8}$ |

The coefficients in these tables have been multiplied by sin $k/\pi 2$ (odd coefficients) and cos $k/\pi 2$ (even coefficients). The quantization algorithm was set to result in 9 bit quantization. Note that the only differences are for the values of the largest coefficients.

The filter coefficients given in Set 1 were obtained without applying constraints to the number of non-zero digits in the signed magnitude representations of the coefficients. This first set of coefficients has a very good phase error performance. For a sinusoidal signal, the peak phase error is 0.035 degrees between $f_s/8$ and $3f_s/8$ and is less than 0.005 degrees between 0.2 $f_s$ to 0.3 $f_s$. The passband ripple is less than 0.005 for the frequency range 0.21 $f_s$, to 0.29 $f_s$ and the peak sidelobe level is 40 dB below the passband gain. If implemented using the filter architecture of FIG. 7, 36 add/subtract operations are required to perform the multiplication and summation operations needed to generate a pair of I and Q data words.

The last three sets of filter coefficients were generated using constraints on the number of non-zero digits required to represent their magnitudes. These sets, in the filter architecture of FIG. 7, require 32, 31 and 30 add/subtract operations, respectively, to implement the multiplication and summation operations required to generate a pair of I and Q data samples. The reduction in the number of add/subtract operations is accompanied by a reduction in the phase error performance. The peak phase error over the frequency range from $f_s/2$ to $3f_s/8$ is 0.079, 0.057 and 0.059 degrees, respectively, for these sets of coefficients. The filter coefficients of Set 3 have a performance that is attractive in several respects. They provide perfect suppression of DC offsets in input data and the passband ripple is less than 0.002 for frequencies from 0.186 $f_s$ to 0.314 $f_s$.

Figure 8A:
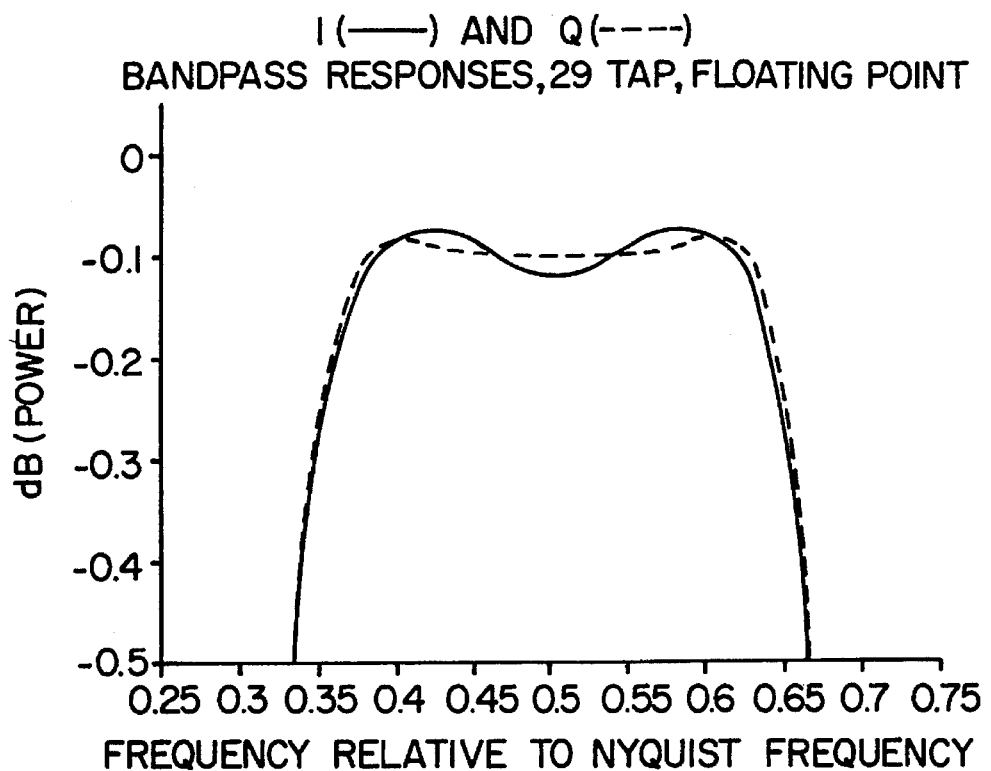
FIGS. 8(a) and 8(b) are graphs showing frequency responses of bandpass equivalents of known inphase and quadrature filters (floating point coefficient representation)
Figure 8B:
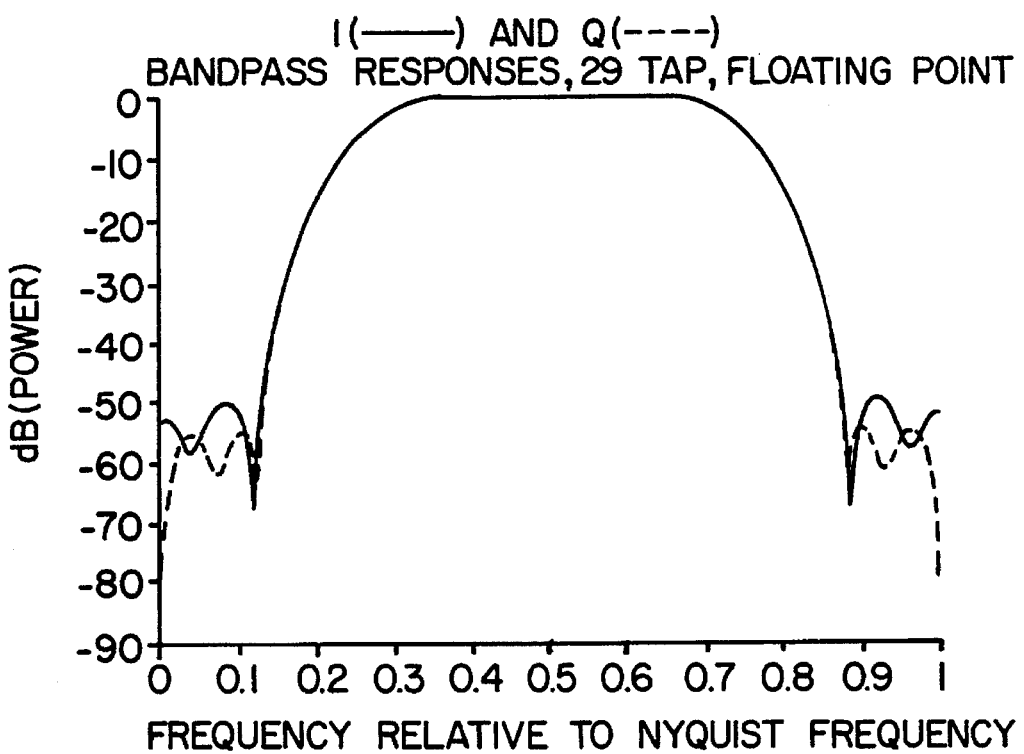
Figure 9A:
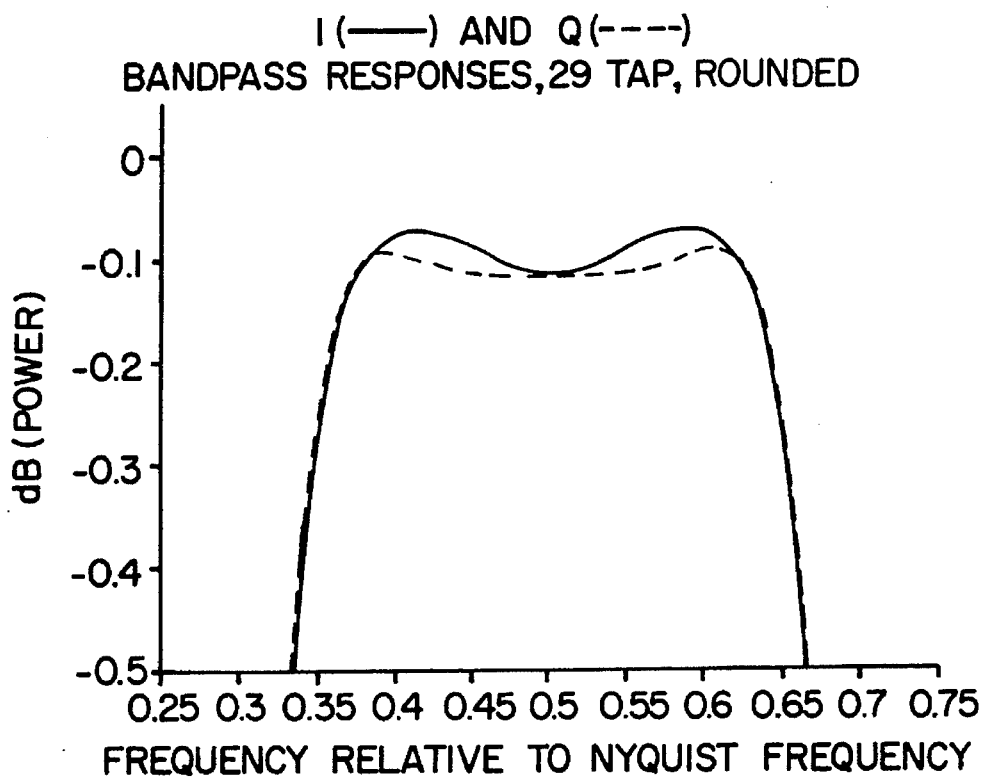
FIGS. 9(a) and 9(b) are graphs showing frequency responses of bandpass equivalents of known inphase and quadrature filters (rounded coefficient representation)
Figure 9B:
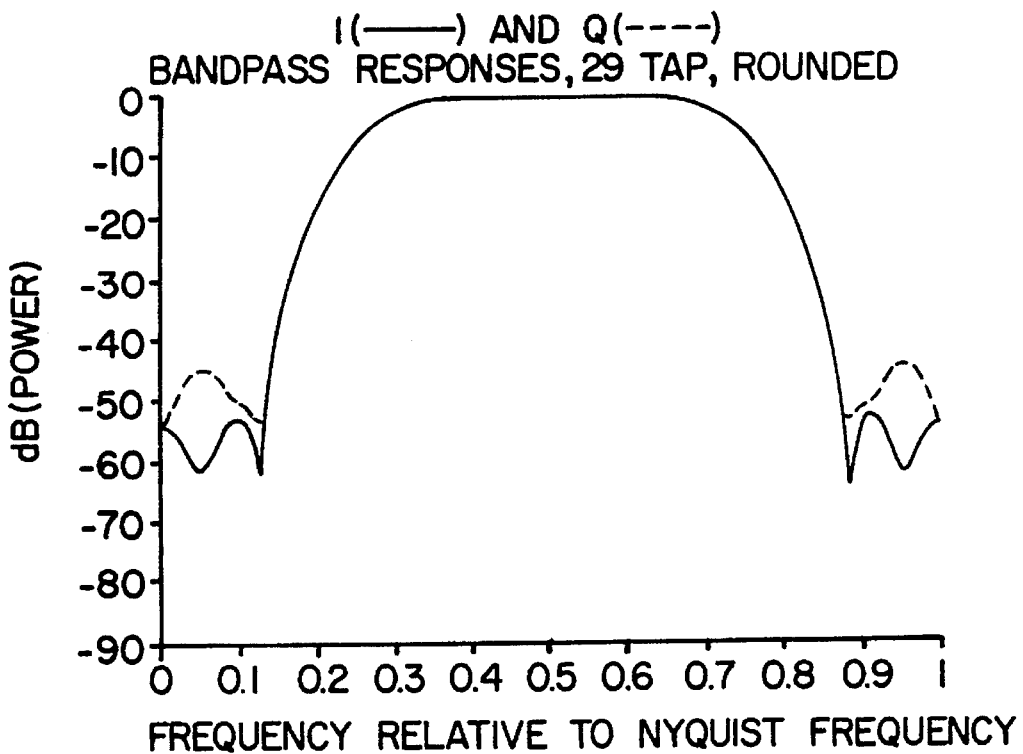
Figure 10A:
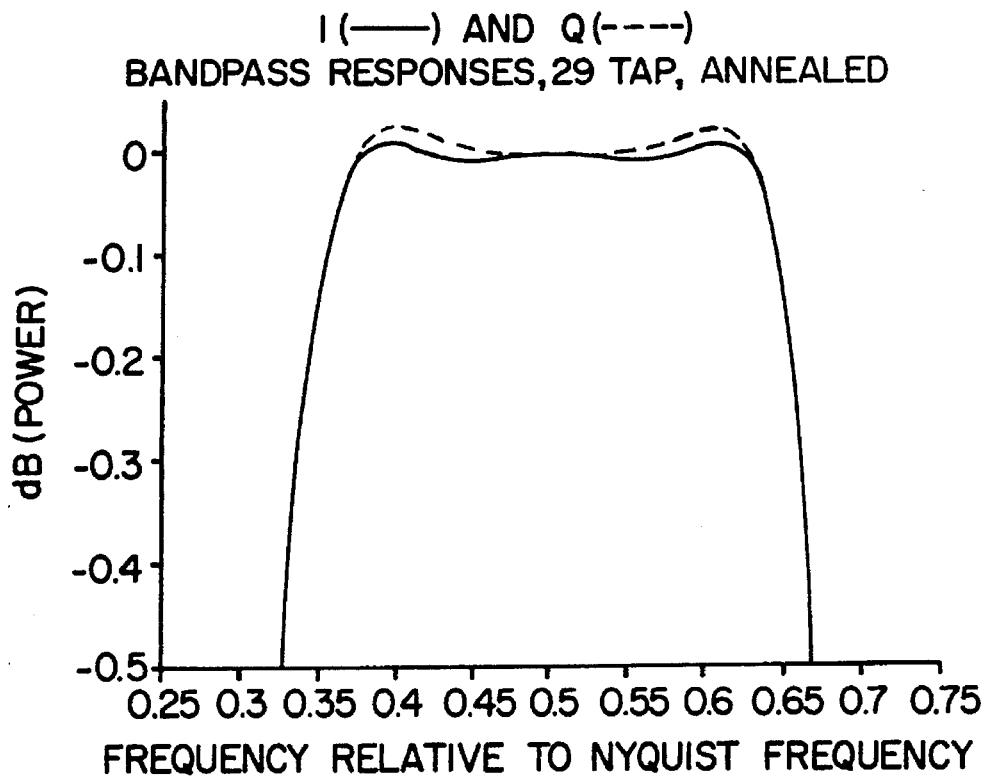
FIGS. 10(a) and 10(b) are graphs showing frequency responses of bandpass equivalents of inphase and quadrature filters (Matched Frequency Response filter coefficients) according to the present invention.
Figure 10B:
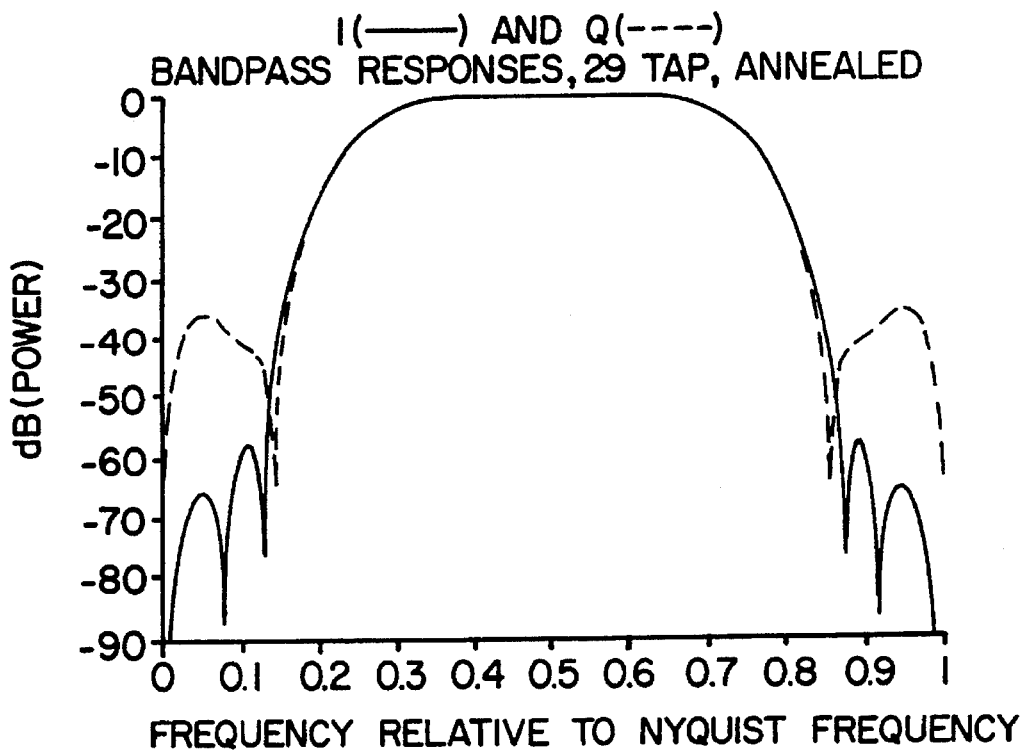

The iterative search procedure provides a significant improvement in phase error performance and implementation cost over the results obtained using only the scaling and rounding operations. The Set 1 filter coefficients provide a peak phase error that is less than half that of the scaled and rounded coefficients obtained from a 29 coefficient prototype filter designed using the Hamming window method, and this improvement is obtained with 9 bit coefficients. The Set 3 coefficients have a lower peak phase error than that of the scaled and rounded coefficients, but can be very cheaply implemented in hardware. The performance of these quadrature demodulation filters also compares well with the performance obtained with the quadrature demodulation filters derived from the prototype filter designed using the Hamming window method. FIGS. 8 (*a*) and (*b*) show the frequency response of the inphase and quadrature channels derived from the prototype filter designed using the Hamming window method. The center frequency of the quadrature demodulator is 0.5 of the Nyquist frequency for the sampling rate of the output data (i.e., $f_s/4$). FIGS. 9 (*a*) and (*b*) show the frequency responses obtained when the filter coefficients used to obtain the results given in FIG. 8 are directly converted to a binary number representation and rounded to 9 bit resolution. It should be noted that the matching of the inphase and quadrature channel frequency responses is generally poorer with the rounded filter coefficients in this example. FIGS. 10(*a*) and (*b*) show the frequency responses of the inphase and quadrature channels for the third set of filter coefficients obtained by applying the scaling and iterative search procedures to the same prototype filter used to obtain the results shown in FIG. 8. The primary disadvantage of the proposed procedure for generating the filter coefficients is that the sidelobe levels in the stopband of the quadrature channel filter have increased, but they are still more than 30 dB below the passband gain for these sets of filter coefficients. The performance obtained with these sets of coefficients is sufficient for many applications. Simulations for sinusoidal input signals have shown that the RMS phase error resulting from the ideal quantization of input data for this type of quadrature demodulator is approximately 0.012 degrees for 11 bit quantization. This suggests that the phase error of the quadrature demodulation filters implemented with the Set 1 filter coefficients can be neglected when the input signal is quantized to a resolution of less than 11 bits.

These filters are economical in hardware to implement. Most of the nonzero filter coefficients can be represented by single fractional powers of 2. The remaining coefficients can be implemented with a maximum of 4 powers of 2. Consequently, although the quadrature filter architecture of FIG. 6 does not make use of the symmetry properties of the filter coefficients to reduce the number of multiplications, there is little or no adverse effect since most of the multipliers are trivial to implement for these coefficients. Note that the number of multipliers required for coefficients $h_{-1}$ and $h_1$ in the quadrature filter can be reduced from 2 to 1 by first taking the difference between the signal samples from decimators 304 and 306 and then performing the multiplication by coefficient $h_1$.

Various modifications may be made to the preferred embodiments without departing from the spirit and scope of the invention as defined in the appended claims.

The embodiments of the invention in which an exclusive property or privilebe is claimed are defined as follows:

1. A digital quadrature demodulator for an intermediate frequency (IF) input signal comprising an analog-to-digital (A/D) converter having sampling frequency $f_s$ and an input to which the IF input signal is applied, the IF input signal having a bandwidth $B<f_s/4$ centred about a freaency of $f_s/4$, wherein the demodulator has means to direct an output signal from the A/D converter to a quadrature channel, means to direct an output signal from the A/D converter to an inphase channel and means to decimate by 4 signals of the channels to generate, together with a first filter means in the quadrature channel, a quadrature output signal Q(nT) at an output of the quadrature channel and, together with a second filter means in the inphase channel, an inphase output signal I(nT) at an output of the inphase channel; the first filter means for a signal in the quadrature channel comprising a quadrature highpass filter having an optimized transform architecture in which the filter coefficients $h_k$ correspond, to those of a lowpass prototype filter with N=2k+1 coefficients after multiplication by $\sin(k\pi/2)$, k identifying a particular stage of the filter, and the second filter means for a signal in the inphase channel comprising an inphase highpass filter having an optimized transform architecture in which the filter coefficients $h_k$ correspond to those of the lowpass prototype filter after multiplication by $\cos(k\pi/2)$.

2. A digital quadrature demodulator as defined in claim 1, wherein the means to direct an output signal from the A/D converter comprises a switch operated at a frequency $f_s/2$ having an input connected to the A/D converter's output, which switch alternately directs every odd sample of the A/D converter's output to the quadrature channel and every even sample of the A/D converter's output to the inphase channel.

3. A digital quadrature demodulator as defined in claim 2, wherein the means to decimate by 4 signals of the channels comprises a first decimate by 2 circuit in the quadrature channel, operated at a sampling frequency $f_s/4$, connected to an output of the quadrature highpass filter to generate said Q(nT) signal at the first decimate by 2 circuit's output and a second decimate by 2 circuit in the inphase channel, operated at a sampling frequency $f_s/4$, connected to an output of the inphase highpass filter to generate said I(nT) signal at the second decimate by 2 circuit's output.

4. A digital quadrature demodulator as defined in claim 3, wherein $h_q$ identifies filter coefficients for the quadrature highpass filter and $h_i$ identifies filter coefficients for the inphase highpass filter and wherein coefficients for the filters derived from a Hamming windowed 21 coefficient lowpass filter prototype are:

$h_q$={0.0049, 0.0168, −0.0479, −0.1209, 0.4397, −0.4397, 0.1209, 0.0479, −0.0168, −0.0049};

and $h_i$={−0.0048, 0.0, 0.0413, 0.0, −0.2896, 0.5, −0.2896, 0.0., 0.0413, 0.0, −0.0048 }.

5. A digital quadrature demodulator as defined in claim 2, wherein the means to decimate by 4 signals of the channels comprises a first decimate by 2 circuit connected to the switch's output for the inphase channel, a second decimate by 2 circuit connected to an output of a first time delay circuit, with a time delay T equal to the sampling period, that is connected to the switch's output for the inphase channel with outputs of the first and second decimate by 2 circuits being connected to first and second inputs of the inphase highpass filter, respectively; the means to decimate by 4 signals of the channels further comprising a third decimate by 2 circuit connected to the switch's output for the quadrature channel, a fourth decimate by 2 circuit connected to an output of a second time delay circuit, with a time delay T equal to the sampling period, that is connected to the switch's output for the quadrature channel with outputs of the third and fourth decimate by 2 circuits being connected to first and second inputs for the quadrature highpass filter, respectively, the decimate by 2 circuits being operated at a sampling frequency $f_s/2$.

6. A digital quadrature demodulator as defined in claim 5, wherein the first input to the inphase filter is connected, in parallel, to a number of multipliers where the signal from the first decimate by 2 circuit is multiplied by an even numbered filter coefficient $h_k$ in each of the multipliers and the second input to the inphase filter is connected to a further multiplier which multiplies its input from the second decimate by 2 circuit by an even numbered filter coefficient $h_k$, where k is smaller than that of the other even numbered coefficients and equal to 0, to provide an output that is directed to an input of a first adder; a first multiplier of said number of multipliers multiplying its input signal by a filter coefficient hk to provide an output which is applied to a second time delay circuit having a time delay period 2T and to an input of a final adder of the inphase filter, an output of the second time delay circuit being applied to one input of a second adder in a first path with another input of the second adder being supplied with an output from a second multiplier of said number of multipliers, the first path containing an additional number of adders equal in number to the remaining number of multipliers of said number of multipliers with an output from each adder in the first path being applied through a 2T time delay circuit to an input of a next adder in the first path, another input of each additional adder in the first path being applied with an output signal from an associated multiplier of said number of multipliers and the last adder in the first path has an input connected to an associated multiplier with a filter coefficient $h_2$ wherein the filter coefficient $h_k$ of a multiplier associated with a preceding adder in the first path is a higher even numbered coefficient than that of the multiplier associated with the next adder in the first path and wherein k−2 is evenly divisible by 4, an output from a last adder in the first path being applied, via a 2T time period delay circuit, to an input of said first adder which has its other input supplied with an output of said further multiplier, an output from said first adder being applied to an input of an initial adder in a second path that has another input supplied from an output of a multiplier associated with the last adder in the first path, the second path having an additional number of adders which are each associated with an adder in the first path and each supplied with an input signal from a multiplier associated with a corresponding adder in the first path, each adder's output in the second path being applied via a 2T period time delay circuit to a next adder in the second path with a last adder in the second path being associated with said second adder which is an initial adder in the first path, an output of that last adder in the second path being applied via a 2T period time delay circuit to an input of said final adder, its other input being supplied with an output from said first multiplier having the largest filter coefficient $h_k$, an output from the final adder providing the inphase I(nT) output signal.

7. A digital quadrature demodulator as defined in claim 6, wherein the first input to the quadrature highpass filter is connected, in parallel, to inputs of a number of further multipliers, each of which multiplies its input from the third decimate by 2 circuit by an odd numbered filter coefficient $h_k$ and the second input to the quadrature filter is connected, in parallel, to a number of still further multipliers, each of which multiplies its input from the fourth decimate by 2 circuit by an odd numbered filter coefficient $h_k$; each of the number of further multipliers being associated with one of the number of still further multipliers with both supplying its output signal to an input of an adder in a third path, the output of each of these adders being supplied, by a time delay circuit with a time delay 2T, to an input of another, following, adder which has inputs connected to outputs of a next further multiplier and its associated still further multiplier, an output from a last adder, which has inputs from a last further multiplier and a last still further multiplier, providing the quadrature Q(nT) output signal; wherein a middle adder in the third path is supplied with an output from a multiplier having a filter coefficient h which is connected to the second input of the quadrature filter and an output from a multiplier having a filter coefficient h which is connected to the first input of the quadrature filter where h is a negative filter coefficient and coefficients for other multipliers in the quadrature highpass filter are ones where k+1 is evenly divisible by 4 and wherein each of the adders preceding the middle adder being associated with multipliers having a filter coefficient that is. the fourth coefficient higher than that of an adjacent multiplier which is nearer to ones associated with the middle adder and each of the adders located after the middle being associated with multipliers having a filter coefficient that is the fourth coefficient less than that of an adjacent multiplier which is nearer to multipliers associated with the middle adder.

8. A digital quadrature demodulator as defined in claim 7, wherein the filter coefficients of each multiplier connected to the second input of the quadrature highpass filter, from an initial multiplier to a last one whose output is applied to the last adder in the quadrature filter, are $h_{13}$, $h_9$, $h_5$, $h_1$, $h_{-3}$, $h_{-7}$ and $h_{-11}$, respectively, while the filter coefficients of multipliers connected to the first input of the quadrature highpass filter, from an initial multiplier to a last one, are $h_{11}$, $h_7$, $h_3$, $h_{-1}$, $h_{-5}$, $h_{-9}$ and $h_{-13}$, respectively.

9. A digital quadrature demodulator as defined in claim 8, wherein the filter coefficients of the multipliers connected to adders in the first path of the inphase filter, from the first multiplier of said number of multipliers to a multiplier connected to the last adder in the first path, are $h_{14}$, $h_{10}$, $h_6$ and $h_2$, respectively.

10. A digital quadrature demodulator as defined in claim 9, wherein the filter coefficients are:

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $-2^{-7}$ |
| $h_{-12}, h_{12}$ | 0.00000000 | |
| $h_{-11}, h_{11}$ | −0.01562500 | $-2^{-8}$ |
| $h_{-10}, h_{10}$ | −0.02724375 | $-2^{-5} + 2^{-8}$ |
| $h_{-9}, h_9$ | 0.02724375 | $2^{-5} - 2^{-8}$ |
| $h_{-8}, h_8$ | 0.000000000 | |
| $h_{-7}, h_7$ | 0.06250000 | $2^{-4}$ |
| $h_{-6}, h_6$ | 0.125 | $2^{-3}$ |
| $h_{-5}, -h_5$ | −0.12109375 | $-2^{-3} + 2^{-8}$ |
| $h_{-4}, h_4$ | 0.00000000 | |
| $h_{-3}, -h_3$ | −0.24609375 | $-2^{-2} + 2^{-8}$ |
| $h_{-2}, h_2$ | −0.558593750 | $-2^{-1} - 2^{-4} + 2^{-8}$ |
| $h_{-1}, -h_1$ | 0.820312500 | $2^{-1} + 2^{-2} + 2^{-4} + 2^{-7}$ |
| $h_0$ | 0.921875000 | $2^{-0} - 2^{-4} - 2^{-6}$ |

11. A digital quadrature demodulator as defined in claim 9, wherein the filter coefficients are:

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $-2^{-7}$ |
| $h_{-12}, h_{12}$ | 0.00000000 | |
| $h_{-11}, h_{11}$ | −0.01562500 | $-2^{-8}$ |
| $h_{-10}, h_{10}$ | −0.03125000 | $-2^{-5}$ |
| $h_{-9}, h_9$ | 0.03125000 | $2^{-5}$ |
| $h_{-8}, h_8$ | 0.000000000 | |
| $h_{-7}, h_7$ | 0.06250000 | $2^{-4}$ |
| $h_{-6}, h_6$ | 0.125 | $2^{-3}$ |
| $h_{-5}, -h_5$ | −0.125 | $-2^{-3}$ |
| $h_{-4}, h_4$ | 0.00000000 | |
| $h_{-3}, -h_3$ | −0.25781250 | $-2^{-2} - 2^{-7}$ |
| $h_{-2}, h_2$ | −0.57812500 | $-2^{-1} - 2^{-4} - 2^{-6}$ |
| $h_{-1}, -h_1$ | 0.84375000 | $2^0 - 2^{-3} - 2^{-5}$ |
| $h_0$ | 0.94921875 | $2^0 - 2^{-5} - 2^{-6} - 2^{-8}$ |

12. A digital quadrature demodulator as defined in claim 9, wherein the filter coefficients are:

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $-2^{-7}$ |
| $h_{-12}, h_{12}$ | 0.00000000 | |
| $h_{-11}, h_{11}$ | −0.015625000 | $-2^{-6}$ |
| $h_{-10}, h_{10}$ | −0.03125000 | $-2^{-5}$ |
| $h_{-9}, h_9$ | 0.03125000 | $2^{-5}$ |
| $h_{-8}, h_8$ | 0.000000000 | |
| $h_{-7}, h_7$ | 0.06250000 | $2^{-4}$ |
| $h_{-6}, h_6$ | 0.125 | $2^{-3}$ |
| $h_{-5}, -h_5$ | −0.125 | $-2^{-3}$ |
| $h_{-4}, h_4$ | 0.00000000 | |
| $h_{-3}, -h_3$ | −0.25000000 | $-2^{-2}$ |
| $h_{-2}, h_2$ | −0.55078125 | $-2^{-1} - 2^{-5} - 2^{-6} - 2^{-8}$ |
| $h_{-1}, -h_1$ | −0.8046875 | $-2^0 + 2^{-3} + 2^{-4} + 2^{-7}$ |
| $h_0$ | 0.90625 | $2^0 - 2^{-3} + 2^{-5}$ |

13. A digital quadrature demodulator as defined in claim 9, wherein the filter coefficients are:

| Filter Coefficients | Decimal Representation | Powers of 2 Representation |
|---|---|---|
| $h_{-14}, h_{14}$ | 0.00390625 | $2^{-8}$ |
| $h_{-13}, h_{13}$ | −0.00781250 | $-2^{-7}$ |

-continued

| Filter Coefficients | Decimal Representation | Powers of 2 Representation |
|---|---|---|
| $h_{-12}, h_{12}$ | 0.00000000 | |
| $h_{-11}, h_{11}$ | −0.015625000 | $-2^{-8}$ |
| $h_{-10}, h_{10}$ | −0.03125000 | $-2^{-5}$ |
| $h_{-9}, h_{9}$ | 0.03125000 | $2^{-5}$ |
| $h_{-8}, h_{8}$ | 0.000000000 | |
| $h_{-7}, h_{7}$ | 0.06250000 | $2^{-4}$ |
| $h_{-6}, h_{6}$ | 0.125 | $2^{-3}$ |
| $h_{-5}, -h_{5}$ | −0.125 | $-2^{-3}$ |
| $h_{-4}, h_{4}$ | 0.00000000 | |
| $h_{-3}, -h_{3}$ | −0.25000000 | $-2^{-2}$ |
| $h_{-2}, h_{2}$ | −0.56250000 | $-2^{-1} - 2^{-4}$ |
| $h_{-1}, -h_{1}$ | 0.83593750 | $2^{0} - 2^{-3} - 2^{-4} - 2^{-7}$ |
| $h_{0}$ | 0.94921875 | $2^{0} - 2^{-5} - 2^{-6} - 2^{-8}$ |

14. A digital quadrature demodulator as defined in claim 1, wherein the means to decimate by 4 signals of the channels comprises a first decimate by 4 circuit connected to the A/D converter's output, which output is connected to another path containing a number of time delay circuits arranged in series to provide 1T, 2T and 3T time delay periods at different points on said another path, T being the sampling period; wherein a point on said another path having a 2T time delay period is connected to an input of a second decimate by 4 circuit with outputs from the first and second decimate by 4 circuit being connected to first and second inputs of inphase highpass filter, respectively, a point on said another path having a 1T time delay period being connected to an input of a third decimate by 4 circuit and a point on said another path having a 3T time delay period being connected to an input of a fourth decimate by 4 circuits with outputs form the third and fourth decimate by 4 circuit being connected to first and second inputs of the quadrature highpass filter, respectively, the decimate by 4 circuits being operated at a sampling frequency $f_s/4$.

15. A digital quadrature demodulator as defined in claim 14, wherein the first input to the inphase filter is connected, in parallel, to a number of multipliers where the signal from the first decimate by 4 circuit is multiplied by an even numbered filter coefficient $h_k$ in each of the multipliers and the second input to the inphase filter is connected to a further multiplier which multiplies its input from the second decimate by 4 circuit by an even numbered filter coefficient $h_k$, where k is smaller than that of the other even numbered coefficients and equal to 0, to provide an output that is directed to an input of a first adder; a first multiplier of said number of multipliers multiplying its input signal by a filter coefficient $h_k$ to provide an output which is applied to a further time delay circuit having a time delay period 4T and to an input of a final adder of the inphase filter, an output of the further time delay circuit being applied to one input of a second adder in a first path with another input of the second adder being supplied with an output from a second multiplier of said number of multipliers, the first path containing an additional number of adders equal in number to the remaining number of multipliers of said number of multipliers with an output from each adder in the first path being applied through a 4T time delay circuit to an input of a next adder in the first path, another input of each additional adder in the first path being applied with an output signal from an associated multiplier of said number of multipliers and the last adder in the first path has an input connected to an associated multiplier with a filter coefficient $h_2$ wherein the filter coefficient $h_k$ of a multiplier associated with a preceding adder in the first path is a higher even numbered coefficient than that of the multiplier associated with the next adder in the first path and wherein k−2 is evenly divisible by 4, an output from a last adder in the first path being applied, via a 4T time period delay circuit, to an input of said first adder which has its other input supplied with an output of said further multiplier, an output from said first adder being applied to an input of an initial adder in a second path that has another input supplied from an output of a multiplier associated with the last adder in the first path, the second path having an additional number of adders which are each associated with an adder in the first path and each supplied with an input signal from a multiplier associated with a corresponding adder in the first path, each adder's output in the second path being applied via a 4T period time delay circuit to a next adder in the second path with a last adder in the second path being associated with said second adder which is an initial adder in the first path, an output of that last adder in the second path being applied via a 4T period time delay circuit to an input of said final adder, its other input being supplied with an output from said first multiplier having the largest filter coefficient $h_k$, an output from the final adder providing the inphase I(nT) output signal.

16. A digital quadrature demodulator as defined in claim 15, wherein the first input to the quadrature highpass filter is connected, in parallel, to inputs of a number of further multipliers, each of which multiplies its input from the third decimate by 4 circuit by an odd numbered filter coefficient $h_k$ and the second input to the quadrature filter is connected, in parallel, to a number of still further multipliers, each of which multiplies its input from the fourth decimate by 4 circuit by an odd numbered filter coefficient $h_k$; each of the number of further multipliers being associated with one of the number of still further multipliers with both supplying its output signal to an input of an adder in a third path, the output of each of these adders being supplied, by a time delay circuit with a time delay 4T, to an input of another, following, adder which has inputs connected to outputs of a next further multiplier and its associated still further multiplier, an output from a last adder, which has inputs from a last further multiplier and a last still further multiplier, providing the quadrature Q(nT) output signal; wherein a middle adder in the third path is supplied with an output from a multiplier having a filter coefficient h which is connected to the second input of the quadrature filter and an output from a multiplier having a filter coefficient $h_{-1}$ which is connected to the first input of the quadrature filter where $h_{-1}$ is a negative filter coefficient and coefficients for other multipliers in the quadrature highpass filter are ones where k+1 is evenly divisible by 4 and wherein each of the adders preceding the middle adder being associated with multipliers having a filter coefficient that is the fourth coefficient higher than that of an adjacent multiplier which is nearer to ones associated with the middle adder and each of the adders located after the middle being associated with multipliers having a filter coefficient that is the fourth coefficient less than that of an adjacent multiplier which is nearer to multipliers associated with the middle adder.

17. A digital quadrature demodulator as defined in claim 16, wherein the filter coefficients of each multiplier connected to the second input of the quadrature highpass filter, from an initial multiplier to a last one whose output is applied to the last adder in the quadrature filter, are $h_{13}$, $h_{9}$, $h_{5}$, $h_{1}$, $h_{-3}$, $h_{-7}$ and $h_{-11}$, respectively, while the filter coefficients of multipliers connected to the first input of the quadrature highpass filter, from an initial multiplier to a last one, are $h_{11}$, $h_{7}$, $h_{3}$, $h_{-1}$, $h_{-5}$, $h_{-9}$ and $h_{-13}$, respectively; and wherein the filter coefficients of the multipliers connected to adders in the first path of the inphase filter, from the first multiplier of said number of multipliers to a multiplier connected to the last adder in the first path, are $h_{14}$, $h_{10}$, $h_6$, and $h_2$, respectively.

18. A method for determining filter coefficients of quadrature and inphase highpass filters in a digital quadrature demodulator for an intermediate frequency (IF) input signal wherein the demodulator comprises an analog-to-digital (A/D) converter having a sampling frequency $f_s$ and an input to which the IF input signal is applied, the IF input signal having a bandwidth $B<f_s/4$ centred about a frequency of $f_s/4$ with the demodulator having means to direct an output signal from the A/D converter to a quadrature channel, means to direct an output signal from the A/D converter to an inphase channel and means to decimate by 4 signals of the channels to generate, together with the quadrature highpass filter in the quadrature channel, a quadrature output signal $Q(nT)$ at an output of the quadrature channel and, together with an inphase highpass filter in the inphase channel, an inphase output signal $I(nT)$ at an output of the inphase channel; the method for determining the filter coefficients comprising a first step with means for deriving a first set of floating point quadrature and inphase filter coefficients from a prototype lowpass filter; a second step with means for obtaining new sets of scaled filter coefficients from said first set by multiplying the first set of coefficients by scale factors uniformly distributed over the range from 0.5 to 1 wherein the scale factors are incremented in a number of steps equal to $I=2^M$ and M is the maximum number of bits allowed for the signed magnitude binary representation of final filter coefficients; a third step with means for converting the sets of scaled filter coefficients to values represented by binary numbers and rounding to generate scaled and quantized sets of filter coefficients $\{h_k\}_i$; a fourth step with means to obtain sets of inphase filter coefficients $\{h_k\}_i$ by multiplying the coefficients $\{h_k\}_i$ by $\cos(k\pi/2)$, then deleting the terms with odd values of k, and means to obtain corresponding sets of quadrature filter coefficients $\{h_{Qk}\}_i$ by multiplying the coefficients $\{h_k\}_i$ by $\sin(k\pi/2)$, then deleting the terms with even values of k, and means for evaluating the performance of each of the $2^M$ pairs of filter coefficients thus obtained and selecting those with the best performance for subsequent processing; a fifth step with means to optimize sets of filter coefficients obtained in the fourth step by an iterative search procedure and determining frequency responses for each new pair of inphase and quadrature filters with means to identify and select a best pair of filters which have a smallest mismatch in their frequency responses.

19. A method as defined in claim 18, wherein the means for evaluating the performance of each of the $2^M$ pairs of filter coefficients in the fourth step consists of obtaining a peak phase error for each pair which is computed using the bound [$\arctan |H_q(f_p)|/|H_i(f_0)| - \pi/4$] where $|H(f_p)|$ is the amplitude of a filter output signal for a unit amplitude sinusoid of frequency $f_p$ and wherein a set of discrete values of $f_p$ is used distributed over a desired bandwidth.

20. A method as defined in claim 18, wherein for each possible pair of nonzero filter coefficients obtained in said third step, eight modified sets of filter coefficients for the prototype filter are constructed by changing at least one member of the pair by ±1 least significant bit to obtain modified sets of filter coefficients from which sets of inphase and quadrature filter coefficients are obtained as in said fourth step and including means for evaluating and selecting the best pair of filters obtained from the modified sets and repeating this process until any improvement in performance measure is unobtainable.

\* \* \* \* \*

UNITED STATES PATENT AND TRADEMARK OFFICE
CERTIFICATE OF CORRECTION

Page 1 of 2

PATENT NO. : 5,504,455
DATED : April 2, 1996
INVENTOR(S) : INKOL, Robert J.

It is certified that error appears in the above-indentified patent and that said Letters Patent is hereby corrected as shown below:

Column 8, line 67, after "coefficients" and before "that" insert the following (missing) line:
  $--\{H_{-K}, h_{-(K-1)}, \ldots, h_{-1}, h_0, h_1, \ldots, h_{(K-1)}, h_K\}--$ Column 11, line 60, delete "$H_k160$" and insert therefor $--h_k \neq 0"--$;

Column 12, line 1, delete "h and $h_{-k}$" and insert therefor $--h_k$ and $h_{-k}$;

Column 12, line 21, after "at" and before "undelayed" insert the following (missing) line:
  $--314$, $h_1$ at 316, $h_{-3}$ at 318, $h_{-7}$ at 320 and $h_{-11}$ at 322. The--;

Column 17, line 8, before "|" insert --[arctan--;

Column 17, line 17, in the equation, change "$|H_i(f_o)|$" to read $--|H_i(f_p)|--$;

Column 17, line 49, delete "$a \approx b$" and insert therefor $--a \doteq b--$;

Column 18, line 64, the third therm from the end of the table, delete "$-2^{-0}-2^{-4}+2^{-8}$" and insert therefor $-- -2^{-1}-2^{-4}+2^{-8} --$;

UNITED STATES PATENT AND TRADEMARK OFFICE
CERTIFICATE OF CORRECTION

PATENT NO. : 5,504,455
DATED : April 2, 1996
INVENTOR(S) : INKOL, Robert J.

It is certified that error appears in the above-indentified patent and that said Letters Patent is hereby corrected as shown below:

Column 22, line 42, delete "hk" and 

Column 23, line 38, delete "h" and insert therefor $--h_1--$;
line 40, delete "h" and insert therefor $--h_{-1}--$;
line 42, delete "h" and insert therefor $--h_{-1}--$;

Column 23, line 46, after "is" and before "the" delete ".";

Column 26, line 41, delete "h" and insert therefor $--h_1--$;

Column 27, line 33, delete "$\{h_k\}_i\}$" and insert therefor $--\{h_{ik}\}_i--$ Signed and Sealed this Fourteenth Day of January, 1997

Attest:

BRUCE LEHMAN

Attesting Officer    Commissioner of Patents and Trademarks